(12) United States Patent
Carroll et al.

(10) Patent No.: US 11,348,761 B2
(45) Date of Patent: May 31, 2022

(54) IMPEDANCE MATCHING APPARATUS AND CONTROL METHOD

(71) Applicant: Tokyo Electron Limited, Tokyo (JP)

(72) Inventors: John Carroll, Austin, TX (US); Jianping Zhao, Austin, TX (US); Peter Ventzek, Austin, TX (US); Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/012,168

(22) Filed: Sep. 4, 2020

(65) Prior Publication Data

US 2022/0076923 A1 Mar. 10, 2022

(51) Int. Cl.
*H01J 37/32* (2006.01)
*H05H 1/46* (2006.01)

(52) U.S. Cl.
CPC ......... *H01J 37/32183* (2013.01); *H05H 1/46* (2013.01)

(58) Field of Classification Search
None
See application file for complete search history.

(56) References Cited

U.S. PATENT DOCUMENTS

| | | | | |
|---|---|---|---|---|
| 4,887,005 A * | 12/1989 | Rough | ............... | H01J 37/32174 422/906 |
| 5,210,466 A * | 5/1993 | Collins | ............. | H01J 37/32174 204/298.34 |
| 5,392,018 A * | 2/1995 | Collins | ................... | H03H 11/30 336/84 C |
| 5,556,501 A * | 9/1996 | Collins | ............... | H01J 37/3222 257/E21.252 |
| 5,572,170 A * | 11/1996 | Collins | ............. | H01J 37/32165 257/E21.252 |
| 5,656,123 A * | 8/1997 | Salimian | ........... | H01J 37/32091 156/345.43 |
| 5,707,486 A * | 1/1998 | Collins | ............. | H01J 37/32082 204/298.34 |
| 6,068,784 A * | 5/2000 | Collins | ................. | H01J 37/321 257/E21.252 |
| 6,251,792 B1 * | 6/2001 | Collins | ............... | H01L 21/6831 257/E21.252 |
| 6,545,420 B1 * | 4/2003 | Collins | ............. | H01J 37/32091 257/E21.252 |
| 6,703,080 B2 * | 3/2004 | Reyzelman | ............... | H05H 1/46 204/192.1 |
| 7,004,107 B1 * | 2/2006 | Raoux | ............... | H01J 37/32174 156/345.43 |
| 7,212,078 B2 * | 5/2007 | Windhorn | ......... | H01J 37/32082 333/263 |
| 7,276,135 B2 * | 10/2007 | Dhindsa | ............ | H01J 37/32935 438/10 |

(Continued)

*Primary Examiner* — Srinivas Sathiraju
(74) *Attorney, Agent, or Firm* — Slater Matsil, LLP

(57) ABSTRACT

A system includes a plasma chamber coupled to a power source, and an impedance matching network coupled between the power source and the plasma chamber, wherein the impedance matching network comprises an L-shaped network and a first adjustable inductor coupled between an input of the plasma chamber and ground, and wherein the impedance matching network is configured such that, in a predetermined frequency range, an impedance of the impedance matching network and the plasma chamber is substantially equal to an impedance of the power source.

6 Claims, 29 Drawing Sheets

(56) References Cited

U.S. PATENT DOCUMENTS

| | | | | |
|---|---|---|---|---|
| 8,686,918 B1* | 4/2014 | Diaz | | H01Q 1/364 |
| | | | | 343/742 |
| 8,773,312 B1* | 7/2014 | Diaz | | H01Q 1/38 |
| | | | | 343/700 MS |
| 8,847,846 B1* | 9/2014 | Diaz | | H01Q 9/27 |
| | | | | 343/895 |
| 9,196,459 B2* | 11/2015 | Bhutta | | H01J 37/248 |
| 9,652,567 B2* | 5/2017 | Valcore, Jr. | | G06F 30/20 |
| 9,872,373 B1* | 1/2018 | Shimizu | | H01J 37/32146 |
| 10,269,540 B1* | 4/2019 | Carter | | H01J 37/32192 |
| 11,017,983 B2* | 5/2021 | Mavretic | | H03F 3/24 |
| 2002/0004309 A1* | 1/2002 | Collins | | H01J 37/32146 |
| | | | | 438/719 |
| 2002/0185227 A1* | 12/2002 | MacGearailt | | H01J 37/32082 |
| | | | | 156/345.43 |
| 2004/0007985 A1* | 1/2004 | de Vries | | H01J 37/32825 |
| | | | | 315/111.91 |
| 2004/0114399 A1* | 6/2004 | Lincoln | | H01J 37/32082 |
| | | | | 363/56.02 |
| 2005/0264219 A1* | 12/2005 | Dhindsa | | H01J 37/32935 |
| | | | | 315/111.21 |
| 2005/0275980 A1* | 12/2005 | Coleman | | H01L 23/473 |
| | | | | 361/20 |
| 2012/0074844 A1* | 3/2012 | York | | H03H 7/40 |
| | | | | 315/111.21 |
| 2012/0188007 A1* | 7/2012 | Van Zyl | | H03K 17/60 |
| | | | | 327/109 |
| 2014/0139218 A1* | 5/2014 | Findeklee | | G01R 33/3628 |
| | | | | 324/318 |
| 2014/0195033 A1* | 7/2014 | Lyndaker | | H01J 37/32183 |
| | | | | 700/121 |
| 2014/0214395 A1* | 7/2014 | Valcore, Jr. | | G06F 30/36 |
| | | | | 703/14 |
| 2015/0179406 A1* | 6/2015 | Johnson | | H03H 7/40 |
| | | | | 716/137 |
| 2015/0319838 A1* | 11/2015 | Bhutta | | H01J 37/32183 |
| | | | | 315/111.21 |
| 2016/0241234 A1* | 8/2016 | Mavretic | | G01R 19/165 |
| 2017/0104469 A1* | 4/2017 | Mavretic | | H03H 7/40 |
| 2018/0019515 A1* | 1/2018 | Zhang | | H01Q 21/28 |
| 2018/0041183 A1* | 2/2018 | Mavretic | | H01L 29/861 |
| 2019/0115191 A1* | 4/2019 | Mavretic | | H02M 1/088 |
| 2019/0172683 A1* | 6/2019 | Mavretic | | H01L 28/20 |
| 2019/0267212 A1* | 8/2019 | Mavretic | | H01L 29/861 |
| 2019/0272978 A1* | 9/2019 | Ahmed | | H01J 37/32183 |
| 2019/0318919 A1* | 10/2019 | Lyndaker | | G05B 17/02 |
| 2020/0144032 A1* | 5/2020 | Ulrich | | H01L 21/28556 |
| 2020/0168439 A1* | 5/2020 | Bhutta | | H01L 22/26 |
| 2020/0176234 A1* | 6/2020 | Abraham | | C23C 14/345 |
| 2020/0411290 A1* | 12/2020 | Oliveti | | H01J 37/32183 |

* cited by examiner

IMPEDANCE MATCHING APPARATUS AND CONTROL METHOD

TECHNICAL FIELD

The present invention relates generally to an impedance matching network in a plasma processing system.

BACKGROUND

Semiconductor fabrication processes may involve various manufacturing techniques including formation, patterning and removing a number of layers over a substrate. Plasma processes are commonly used in various steps of semiconductor fabrication processes. For example, reactive ion etching (RIE), plasma-enhanced CVD (PECVD) and plasma-enhanced atomic layer deposition (PEALD) are common process steps in the fabrication of semiconductor devices.

The plasma used in the semiconductor fabrication processes is commonly generated in a plasma chamber. A gas source supplies a process gas to the plasma chamber. A high frequency radio frequency (RF) power source is coupled to the plasma chamber through an impedance matching network. The RF power source drives current through the gas in the plasma chamber. In response to the current through gas, the atoms of the gas break down into freely moving charged particles that form the plasma. The plasma can be used to perform various semiconductor fabrication processes such as deposition processes, etching processes and the like.

An impedance matching network is needed for efficiently delivering power from the RF power source to an antenna of the plasma chamber. More particularly, the impedance matching network is employed to eliminate the reflected power at the power source/antenna interface so that the maximum power output from the power source is delivered into the plasma chamber. The impedance matching network is an L-shaped matching network consisting of only two capacitors. A shunt capacitor is coupled between the output of the power source and ground. A series capacitor is coupled between the output of the power source and the input of the plasma chamber. Both the shunt capacitor and the series capacitor may be implemented as adjustable capacitors.

As the plasma processes in the semiconductor industry further advance, the plasma may operate in a wide frequency range. The existing L-shaped matching network is not able to provide impedance matching over such a wide frequency range. Thus, there is a need to improve the impedance matching network so as to meet the requirements of the ever-changing plasma processes.

SUMMARY

In accordance with an embodiment, an apparatus comprises a load configured to operate in a predetermined frequency range, a power supply configured to provide power for the load, and an impedance matching network coupled between the power supply and the load, wherein the impedance matching network comprises a first adjustable inductor coupled between an input of the load and ground, and the impedance matching network is configured such that, in the predetermined frequency range, an impedance of the impedance matching network and the load equals an impedance of the power supply.

In accordance with another embodiment, a method comprises providing power from a power supply to a load, wherein an impedance matching network is coupled between an output of the power supply and an input of the load, the impedance matching network comprising an adjustable inductor coupled between the input of the load and ground, configuring the load to operate at a first frequency, and based on the first frequency, adjusting the impedance matching network such that an impedance of the impedance matching network and the load equals an impedance of the power supply.

In accordance with yet another embodiment, a system comprises a plasma chamber coupled to a power source, and an impedance matching network coupled between the power source and the plasma chamber, wherein the impedance matching network comprises an L-shaped network and a first adjustable inductor coupled between an input of the plasma chamber and ground, and wherein the impedance matching network is configured such that, in a predetermined frequency range, an impedance of the impedance matching network and the plasma chamber is substantially equal to an impedance of the power source.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an apparatus and method for testing an analog-to-digital converter of a digital microphone. The present disclosure may also be applied, however, to a variety of systems and applications that convert an analog signal generated by any sensors into a digital signal. Hereinafter, various embodiments will be explained in detail with reference to the accompanying drawings.

Figure 1:
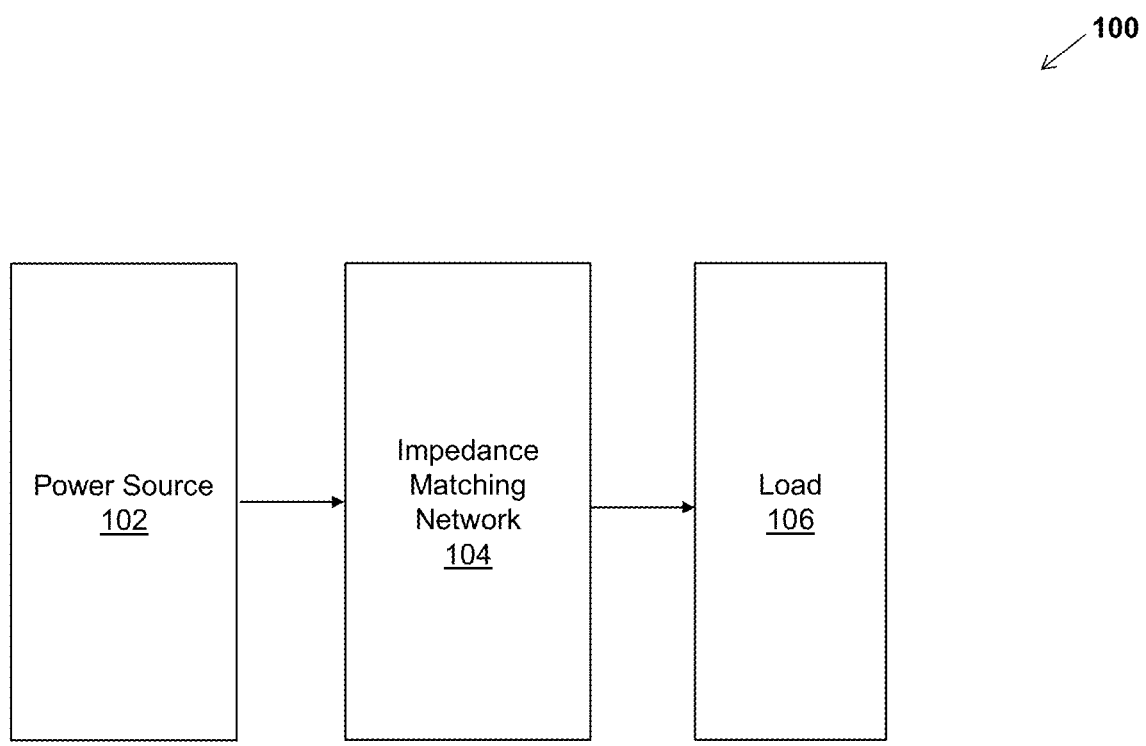
FIG. 1 illustrates a block diagram of a plasma processing system in accordance with various embodiments of the present disclosure.

FIG. 1 illustrates a block diagram of a plasma processing system in accordance with various embodiments of the present disclosure. The plasma processing system 100 comprises a power source 102, an impedance matching network 104 and a load 106. As shown in FIG. 1, the output of the power source 102 is coupled to the input of the load 106 through the impedance matching network 104.

In some embodiments, the load 106 is a plasma processing chamber such as a very high frequency (VHF) plasma chamber. The plasma processing chamber may be a vacuum chamber. The plasma processing chamber may comprise any suitable elements such as a process gas input, a substrate holder, a RF antenna and the like. In some embodiments, the plasma processing chamber is configured to operate in a frequency range from about 400 kHz to about 220 MHz.

In some embodiments, the plasma process generated in the plasma processing chamber may be an etch process such as a Reactive Ion Etch (RIE) process, an Atomic Layer Etch (ALE) process or the like. In alternative embodiments, the plasma process generated in the plasma processing chamber may be a deposition process such as a Plasma-Enhanced Physical Vapor Deposition (PVD) process, a Plasma-Enhanced Chemical Vapor Deposition (CVD) process, an Atomic Layer Deposition (ALD) process or the like.

The power source 102 is employed to provide RF power to the load 106. The RF power is used to sustain the plasma. The source impedance of the power source 102 may be predetermined (e.g., 50 ohm). In order to prevent the RF power from being reflected back to the power source 102, the impedance matching network 104 is employed to match the load to the source impedance (e.g., 50 ohm) of power source 102 over the wide operating frequency range of the plasma chamber. Throughout the description, the power source 102 may be alternatively referred to as a power supply.

The impedance matching network 104 comprises an L-shaped impedance matching network and at least one inductor. The L-shaped impedance matching network comprises adjustable capacitive elements. The at least one inductor may be implemented as an adjustable inductor. In operation, when the operating frequency of the plasma chamber varies in the wide operating frequency range, the impedance matching network 104 is adjusted so that the impedance of the impedance matching network 104 and the plasma chamber equals the impedance of the power source 102. The detailed structures of the impedance matching network 104 will be described below with respect to FIGS. 2-21 and 29.

Figure 2:
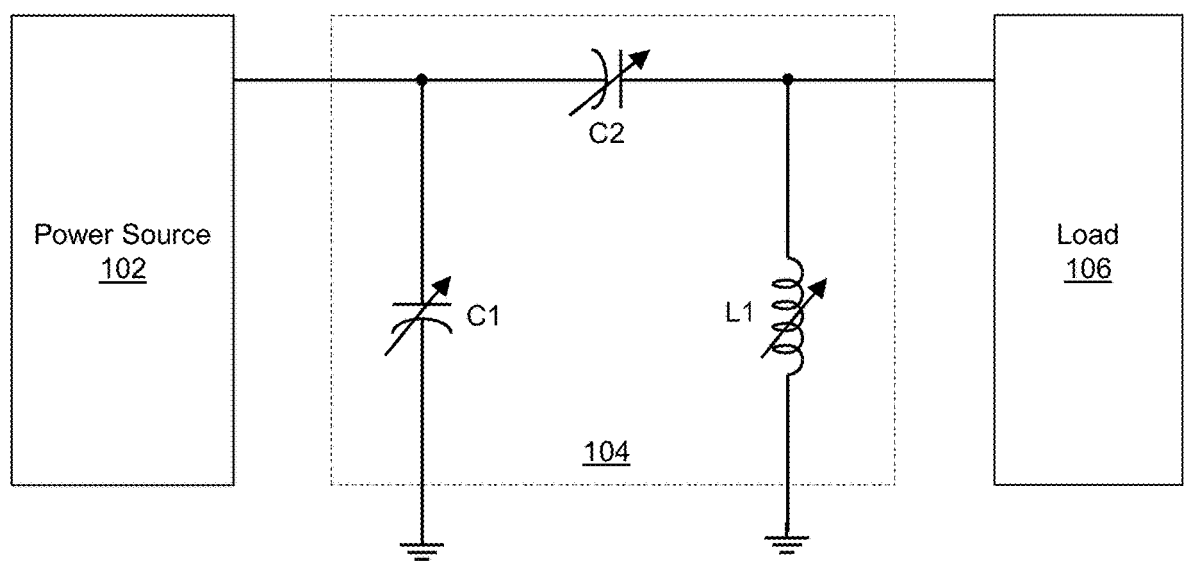
FIG. 2 illustrates a first implementation of the impedance matching network shown in FIG. 1 in accordance with various embodiments of the present disclosure.

FIG. 2 illustrates a first implementation of the impedance matching network shown in FIG. 1 in accordance with various embodiments of the present disclosure. The impedance matching network 104 comprises a first capacitor C1, a second capacitor C2 and a first inductor L1. The first capacitor C1 is coupled between an output of the power source 102 and ground. The second capacitor C2 is coupled between the output of the power source 102 and an input of the load 106. The first inductor L1 is coupled between the output of the input of the load 106 and ground.

In embodiments, the first capacitor C1 is implemented as an adjustable capacitor. For example, the first capacitor C1 may comprise a plurality of switch-capacitor networks connected in parallel. Each switch-capacitor network comprises a capacitor and a switch connected in series. By controlling the on and off of the switches of the plurality of switch-capacitor networks, the capacitance of the first capacitor C1 varies accordingly. Alternatively, the first capacitor C1 may have its capacitance changed by mechanical motion. For example, the distance and/or the overlapping area of the two plates of the first capacitor C1 may be adjustable through a suitable mechanical construction. In some embodiments, the first capacitor C1 is able to vary in a range from about 3 pF to about 4000 pF.

It should be noted that while FIG. 2 illustrates the first capacitor C1 is implemented as an adjustable capacitor, this is merely an example. Depending on different applications and design needs, the first capacitor C1 may be implemented as a capacitor having a fixed capacitance value. It should further be noted that while FIG. 2 illustrates the first capacitor C1 is implemented as a polarized capacitor as indicated by the symbol of the first capacitor C1, this is merely an example. Depending on different applications and design needs, the first capacitor C1 may be implemented as a non-polarized capacitor.

In some embodiments, the first capacitor C1 may be implemented as any suitable capacitors such as ceramic capacitors, film capacitors, electrolytic capacitors, polymer capacitors, any combinations thereof and the like.

The second capacitor C2 is similar to the first capacitor C1, and hence the structure and the operating principle of the second capacitor C2 are not discussed in detail herein. In some embodiments, the second capacitor C2 is implemented as an adjustable capacitor. The second capacitor C2 is able to vary in a range from about 3 pF to about 4000 pF.

Throughout the description, the first capacitor C1 may be alternatively referred to as a shunt capacitor. The second capacitor C2 may be alternatively referred to as a series capacitor.

In some embodiments, the first inductor L1 is implemented as an adjustable inductor as shown in FIG. 2. The first inductor L1 may comprise a plurality of switch-inductor networks connected in parallel or in series. In a first implementation of this adjustable inductor, each switch-inductor network comprises an inductor and a switch connected in parallel, and the plurality of switch-inductor networks is connected in series. By controlling the on and off of the switches of the plurality of switch-inductor networks, the inductance of the first inductor L1 varies accordingly. The first implementation of this adjustable inductor will be described below with respect to FIG. 23. In a second implementation of this adjustable inductor, each switch-inductor network comprises an inductor and a switch connected in series, and the plurality of switch-inductor networks is connected in parallel. By controlling the on and off of the switches of the plurality of switch-inductor networks, the inductance of the first inductor L1 varies accordingly. The second implementation of this adjustable inductor will be described below with respect to FIG. 24.

Alternatively, the first inductor L1 may have its inductance changed by mechanical motion. For example, the coupling between the magnetic core and the coil of the first inductor L1 may be adjustable through a suitable mechanical construction. The implementation of this adjustable inductor will be described below with respect to FIG. 23.

In some embodiments, the inductance of the first inductor L1 is in a range from about 50 nH to about 2500 nH. It should be noted that, depending on different applications and design needs, the first inductor L1 may be implemented as an inductor having a fixed inductance value. In operation, the load 106 is configured to operate in a predetermined frequency range. In some embodiment, the predetermined frequency range is from about 400 kHz to about 220 MHz. The power source 102 is configured to provide power for the load 106. The impedance matching network 104 is configured such that, in the predetermined frequency range, the impedance of the impedance matching network 104 and the load 106 equals an impedance of the power source 102. More particularly, the load 106 is configured to operate at a first frequency within the predetermined frequency range. Based on the first frequency, the first capacitor C1, the second capacitor C2 and the first inductor L1 are adjusted individually or in combination such that the impedance of the impedance matching network 104 and the load 106 equals the impedance of the power source 102.

One advantageous feature of having the first inductor L1 is that the first inductor L1, as an adjustable inductor, can increase the range of the impedance variation of the impedance matching network 104. In the conventional L-shaped impedance matching network, only capacitive elements are available for adjusting the impedance of the L-shaped impedance matching network. The capacitive elements have a limited impedance variation range. By adding the first inductor L1 into the impedance matching network shown in FIG. 2, the impedance variation range can be further extended. For example, the conventional L-shaped impedance matching network can only provide impedance matching when the load 106 operates in a limited frequency range (e.g., from about 60 MHz to 100 MHz). By contrast, the impedance matching network 104 can provide impedance matching when the load 106 operates in a wide frequency range (e.g., from about 400 kHz to 220 MHz).

Figure 3:
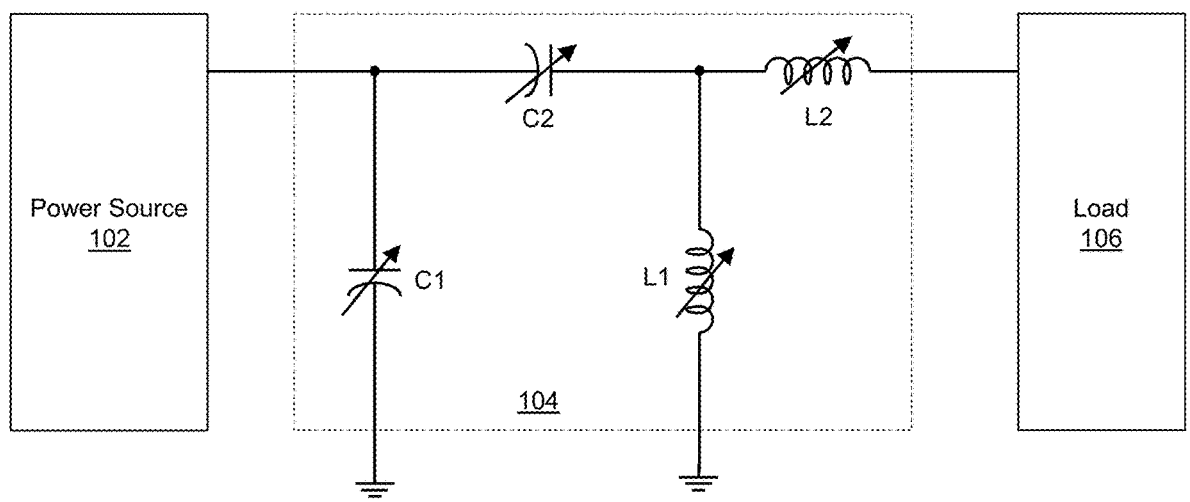
FIG. 3 illustrates a second implementation of the impedance matching network shown in FIG. 1 in accordance with various embodiments of the present disclosure.

FIG. 3 illustrates a second implementation of the impedance matching network shown in FIG. 1 in accordance with various embodiments of the present disclosure. The second implementation of the impedance matching network 104 shown in FIG. 3 is similar to the first implementation shown in FIG. 2 except that the impedance matching network 104 comprises a second inductor L2. The second inductor L2 is coupled between a common node of the second capacitor C2 and the first inductor L1, and the input of the load 106. In some embodiments, the second inductor L2 is similar to the first inductor L1, and hence the structure and operating principle of the second inductor L2 are not discussed in detail to avoid repetition. In some embodiments, the inductance of the second inductor L2 is in a range from about 50 nH to about 2500 nH. It should be noted that, depending on different applications and design needs, the second inductor L2 may be implemented as an inductor having a fixed inductance value or a variable inductance value.

In operation, based on the operating frequency of the load 106, the first capacitor C1, the second capacitor C2, the first inductor L1 and the second inductor L2 are adjusted individually or in combination such that the impedance of the impedance matching network 104 and the load 106 equals the impedance of the power source 102.

Figure 4:
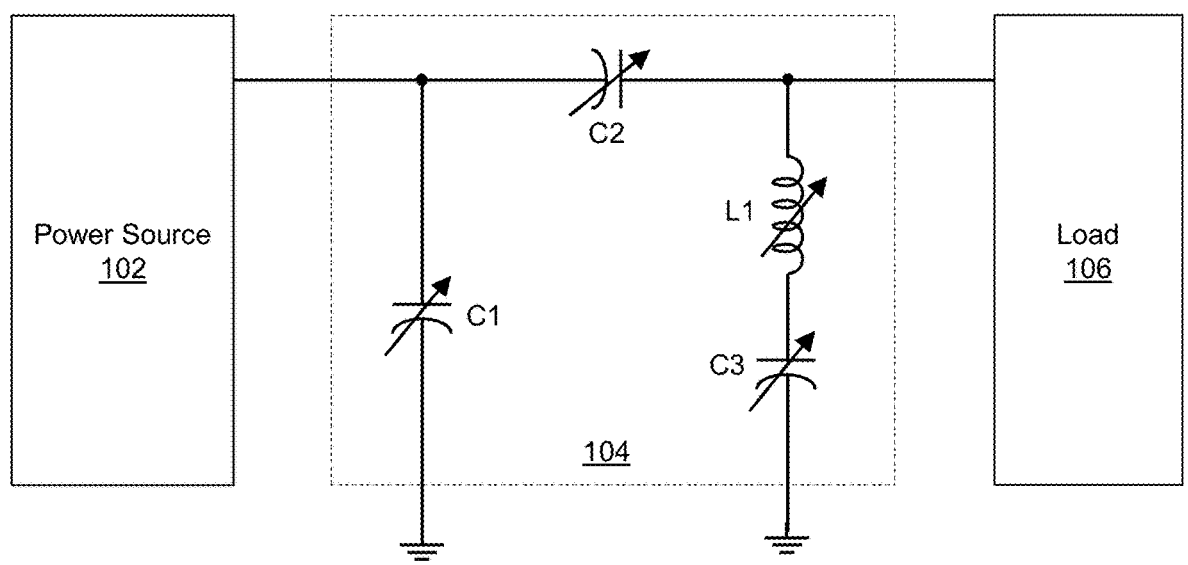
FIG. 4 illustrates a third implementation of the impedance matching network shown in FIG. 1 in accordance with various embodiments of the present disclosure.

FIG. 4 illustrates a third implementation of the impedance matching network shown in FIG. 1 in accordance with various embodiments of the present disclosure. The third implementation of the impedance matching network 104 shown in FIG. 4 is similar to the first implementation shown in FIG. 2 except that the impedance matching network 104 comprises a third capacitor C3. The third capacitor C3 and the first inductor L1 are connected in series between the input of the load 106 and ground. In some embodiments, the third capacitor C3 is similar to the first capacitor C1 and/or the second capacitor C2, and hence is not discussed in detail to avoid repetition. In some embodiments, the third capacitor C3 has a fixed inductance value. Alternatively, the third capacitor C3 is an adjustable capacitor. The capacitance of the third capacitor C3 varies in a range from about 1.5 pF to about 300 pF.

It should be noted that the connection shown in FIG. 4 is merely an example, which should not unduly limit the scope of the claims. One of ordinary skill in the art would recognize many variations, alternatives, and modifications. For example, the third capacitor C3 may be connected to the input of the load 106, and the first inductor L1 is connected to ground. In other words, depending on different design needs, the first inductor L1 and the third capacitor C3 may be swapped.

In operation, based on the operating frequency of the load 106, the first capacitor C1, the second capacitor C2, the third capacitor C3 and the first inductor L1 are adjusted individually or in combination such that the impedance of the impedance matching network 104 and the load 106 equals the impedance of the power source 102.

Figure 5:
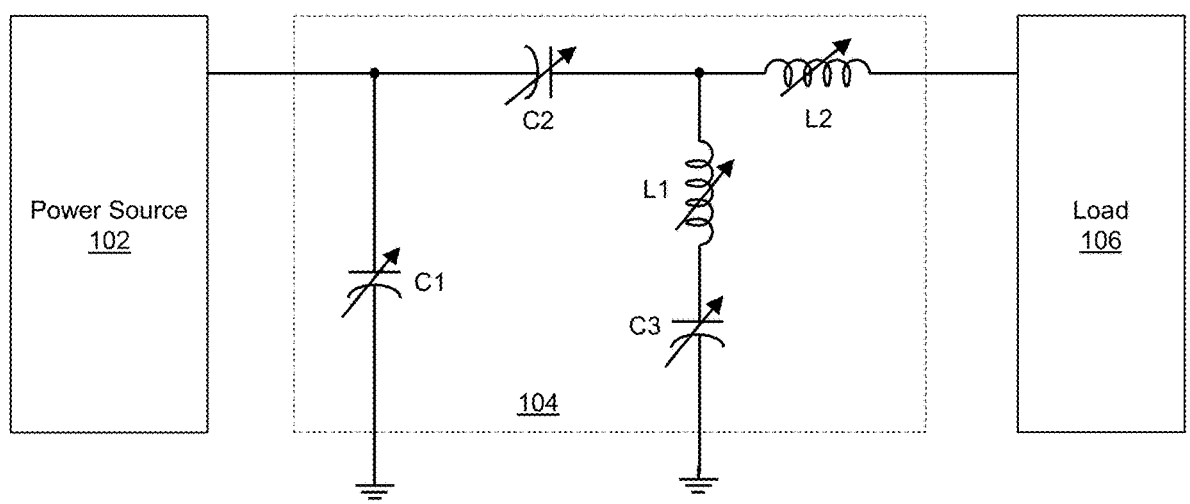
FIG. 5 illustrates a fourth implementation of the impedance matching network shown in FIG. 1 in accordance with various embodiments of the present disclosure.

FIG. 5 illustrates a fourth implementation of the impedance matching network shown in FIG. 1 in accordance with various embodiments of the present disclosure. The fourth implementation of the impedance matching network 104 shown in FIG. 5 is a combination of the impedance matching networks shown in FIG. 3-4. As shown in FIG. 5, a third capacitor C3 and the first inductor L1 are connected in series between a common node of the second capacitor C2 and a second inductor L2, and ground. The second inductor L2 is coupled between a common node of the second capacitor C2 and the first inductor L1 and the input of the load 106.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102.

Figure 6:
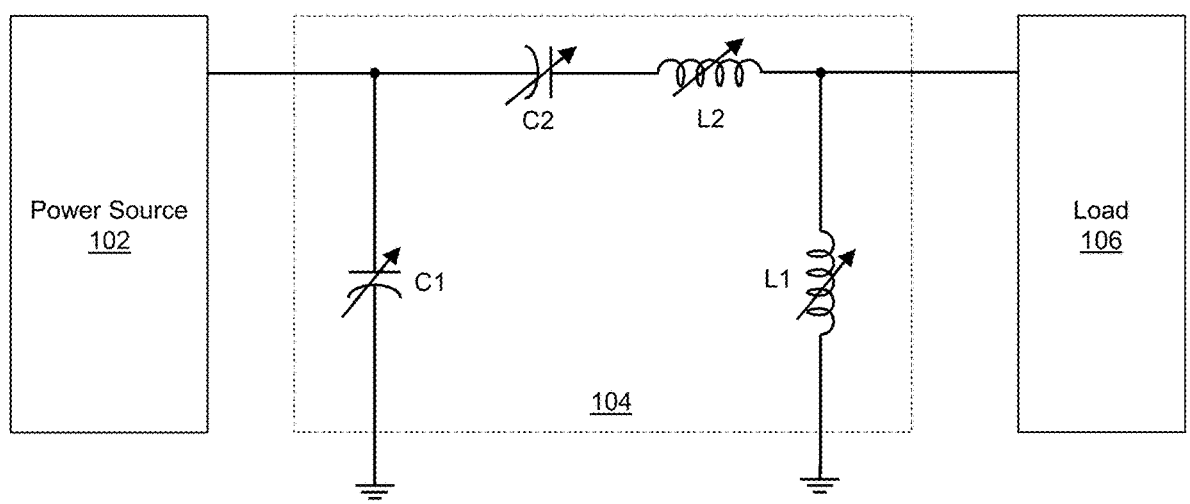
FIG. 6 illustrates a fifth implementation of the impedance matching network shown in FIG. 1 in accordance with various embodiments of the present disclosure.

FIG. 6 illustrates a fifth implementation of the impedance matching network shown in FIG. 1 in accordance with various embodiments of the present disclosure. The fifth implementation of the impedance matching network 104 shown in FIG. 6 is similar to the first implementation shown in FIG. 2 except that the impedance matching network 104 comprises a second inductor L2. The second inductor L2 is coupled between the second capacitor C2, and a common node of the first inductor L1 and the input of the load 106 as shown in FIG. 6. The second inductor L2 is similar to the first inductor L1, and hence is not discussed in detail.

In operation, based on the operating frequency of the load 106, the first capacitor C1, the second capacitor C2, the first inductor L1 and the second inductor L2 are adjusted individually or in combination such that the impedance of the impedance matching network 104 and the load 106 equals the impedance of the power source 102.

Figure 7:
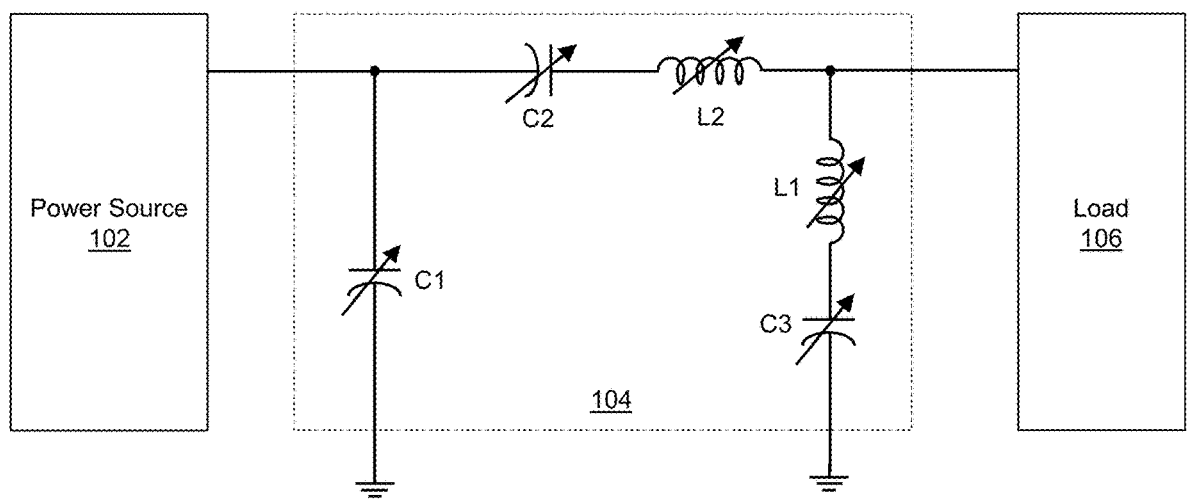
FIG. 7 illustrates a sixth implementation of the impedance matching network shown in FIG. 1 in accordance with various embodiments of the present disclosure.

FIG. 7 illustrates a sixth implementation of the impedance matching network shown in FIG. 1 in accordance with various embodiments of the present disclosure. The sixth implementation of the impedance matching network 104 shown in FIG. 7 is similar to the fifth implementation shown in FIG. 6 except that the impedance matching network 104 comprises a third capacitor C3. The third capacitor C3 and the first inductor L1 are connected in series between the input of the load 106 and ground. The third capacitor C3 is similar to the first capacitor C1 and/or the second capacitor C2, and hence is not discussed in detail to avoid repetition.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102.

It should be noted that the connection shown in FIG. 7 is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 8:
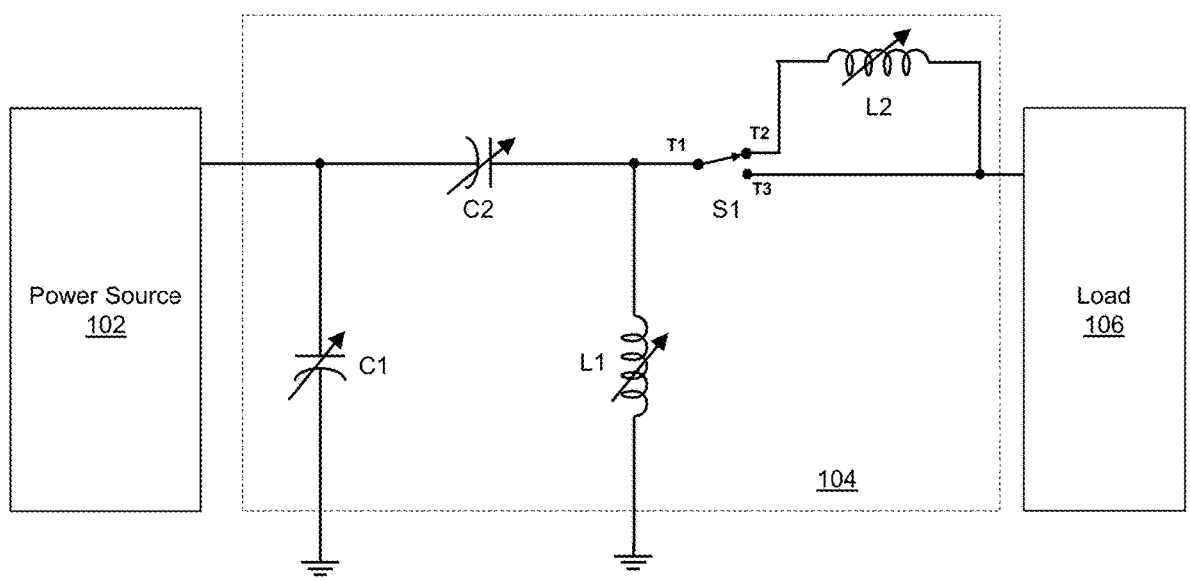
FIG. 8 illustrates a seventh implementation of the impedance matching network shown in FIG. 1 in accordance with various embodiments of the present disclosure.

FIG. 8 illustrates a seventh implementation of the impedance matching network shown in FIG. 1 in accordance with various embodiments of the present disclosure. The seventh implementation of the impedance matching network 104 shown in FIG. 3 is similar to the first implementation shown in FIG. 2 except that the impedance matching network 104 comprises a second inductor L2 and a switch S1. As shown in FIG. 8, the switch S1 functions as a path selector. More particularly, the switch S1 is configured such that the second inductor L2 functions as a selectable element of the impedance matching network 104 by controlling the switch S1.

As shown in FIG. 8, the switch S1 has three terminals. A first terminal T1 is connected to the common node of the second capacitor C2 and the first inductor L1. A second terminal T2 is connected to the second inductor L2. A third terminal T3 is connected to the input of the load 106 directly.

As shown in FIG. 8, the second inductor L2 is coupled between the second terminal T2 of the switch S1 and the input of the load 106. The second inductor L2 is similar to the first inductor L1, and hence is not discussed in detail to avoid repetition.

The switch S1 may be implemented as any suitable switches such as mechanical switches, solid state switches, any combinations thereof and the like. In some embodiments, the switch S1 may be formed by two isolation switches. A first isolation switch comprises two back-to-back connected transistors. A second isolation switch comprises two back-to-back connected transistors. A first terminal of the first isolation switch and a first terminal of the second isolation switch are connected together and further coupled to the common node of the second capacitor C2 and the first inductor L1. A second terminal of the first isolation switch and a second terminal of the second isolation switch are connected to the second inductor L2 and the input of the load 106, respectively. The detailed schematic diagram of the switch S1 will be described below with respect to FIG. 25.

The transistors of the isolation switches may be insulated gate bipolar transistor (IGBT) devices. Alternatively, the transistors of the isolation switches can be any controllable switches such as integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, gallium nitride (GaN) based power devices, silicon carbide (SiC) based power devices and/or the like.

In alternative embodiments, the switch S1 may be formed by high power RF coaxial relay switches, automated mechanical switches and the like.

In operation, based on the operating frequency of the load 106, the first capacitor C1, the second capacitor C2, the first inductor L1 and the second inductor L2 are adjusted individually or in combination such that the impedance of the impedance matching network 104 and the load 106 equals the impedance of the power source 102. The switch S1 is employed to provide one more control variable for providing impedance matching. In particular, by controlling the switch S1, the second inductor L2 becomes a selectable element of the impedance matching network 104.

Figure 9:
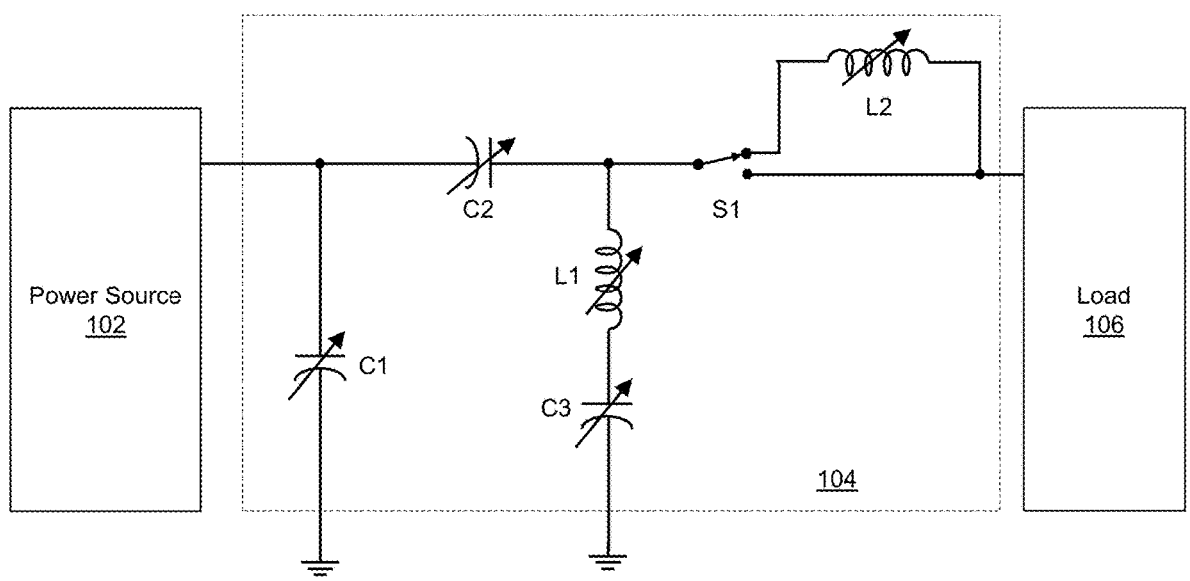
FIG. 9 illustrates an eighth implementation of the impedance matching network shown in FIG. 1 in accordance with various embodiments of the present disclosure.

FIG. 9 illustrates an eighth implementation of the impedance matching network shown in FIG. 1 in accordance with various embodiments of the present disclosure. The eighth implementation of the impedance matching network 104 shown in FIG. 9 is similar to the seventh implementation shown in FIG. 8 except that the impedance matching network 104 comprises a third capacitor C3. The third capacitor C3 and the first inductor L1 are connected in series as shown in FIG. 9.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102. Furthermore, the switch S1 provides one more control variable for adjusting the impedance of the impedance matching network 104.

It should be noted that the connection shown in FIG. 9 is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 10:
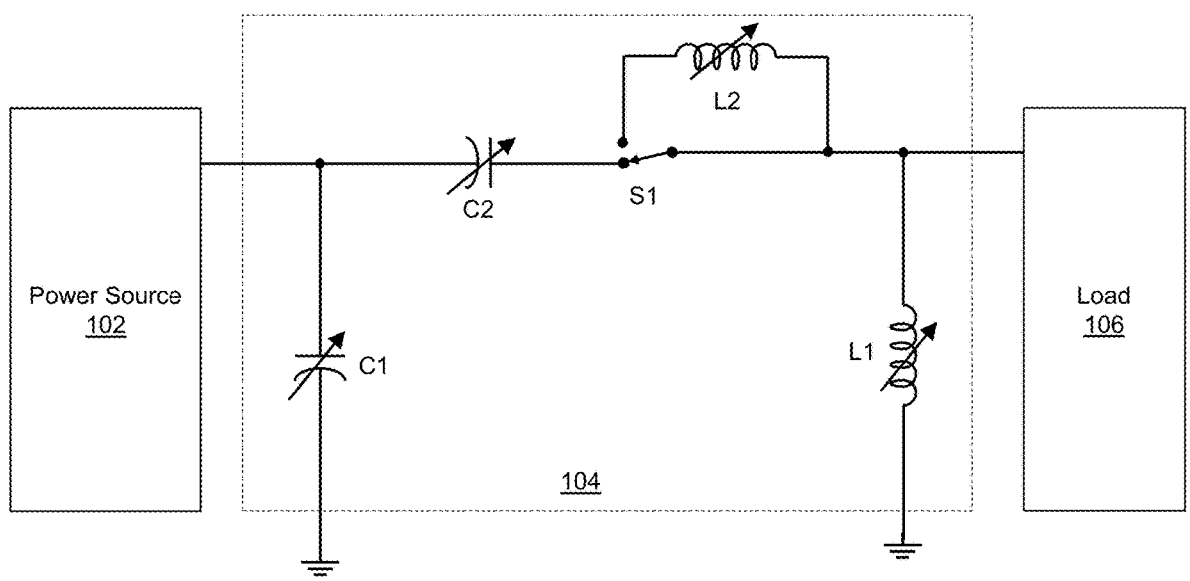
FIG. 10 illustrates a ninth implementation of the impedance matching network shown in FIG. 1 in accordance with various embodiments of the present disclosure.

FIG. 10 illustrates a ninth implementation of the impedance matching network shown in FIG. 1 in accordance with various embodiments of the present disclosure. The ninth implementation of the impedance matching network 104 shown in FIG. 10 is similar to the seventh implementation shown in FIG. 8 except that the switch S1 and the second inductor L2 are coupled between the second capacitor C2, and a common node of the first inductor L1 and the input of the load 106.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102. Furthermore, the switch S1 provides one more control variable for adjusting the impedance of the impedance matching network 104.

Figure 11:
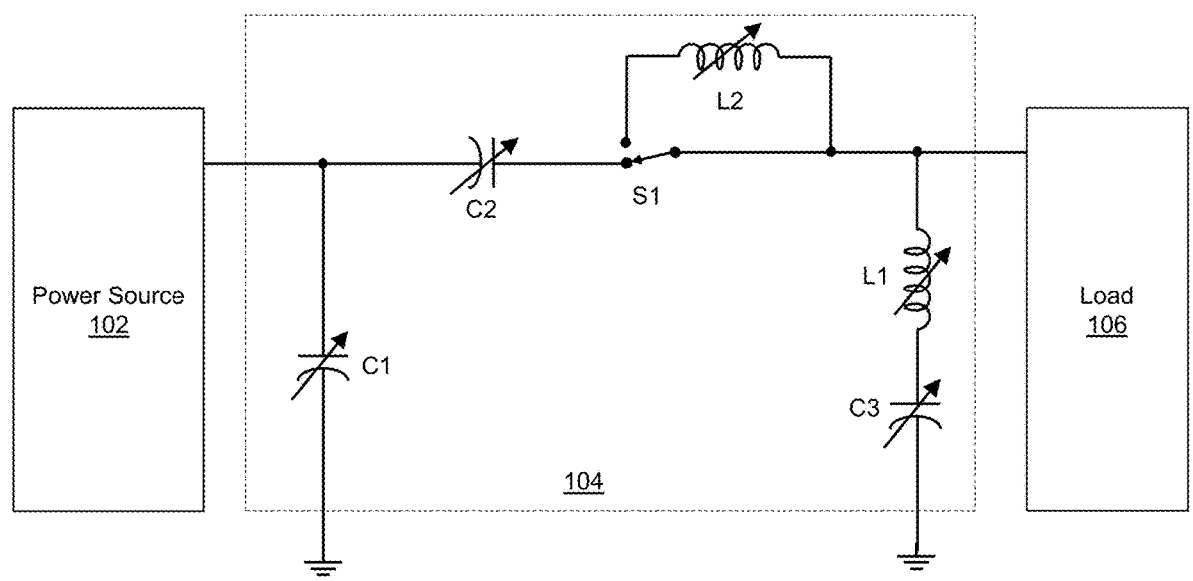
FIG. 11 illustrates a tenth implementation of the impedance matching network shown in FIG. 1 in accordance with various embodiments of the present disclosure.

FIG. 11 illustrates a tenth implementation of the impedance matching network shown in FIG. 1 in accordance with various embodiments of the present disclosure. The tenth implementation of the impedance matching network 104 shown in FIG. 11 is similar to the ninth implementation shown in FIG. 10 except that the impedance matching network 104 comprises a third capacitor C3. The third capacitor C3 and the first inductor L1 are connected in series between the input of the load 106 and ground.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102. Furthermore, the switch S1 provides one more control variable for adjusting the impedance of the impedance matching network 104.

It should be noted that the connection shown in Figure ii is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 12:
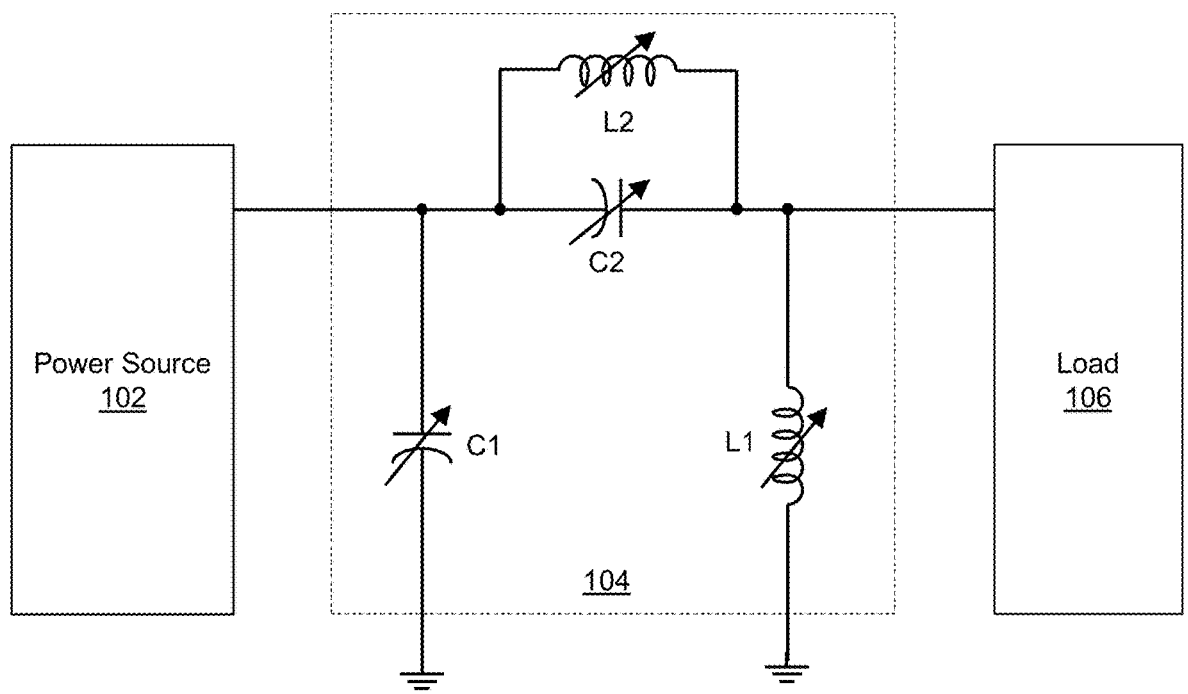
FIG. 12 illustrates an eleventh implementation of the impedance matching network shown in FIG. 1 in accordance with various embodiments of the present disclosure.

FIG. 12 illustrates an eleventh implementation of the impedance matching network shown in FIG. 1 in accordance with various embodiments of the present disclosure. The eleventh implementation of the impedance matching network 104 shown in FIG. 12 is similar to the first implementation shown in FIG. 2 except that the impedance matching network 104 comprises a second inductor L2. The second inductor L2 is coupled in parallel with the second capacitor C2.

In operation, based on the operating frequency of the load 106, the first capacitor C1, the second capacitor C2, the first inductor L1 and the second inductor L2 are adjusted individually or in combination such that the impedance of the impedance matching network 104 and the load 106 equals the impedance of the power source 102.

Figure 13:
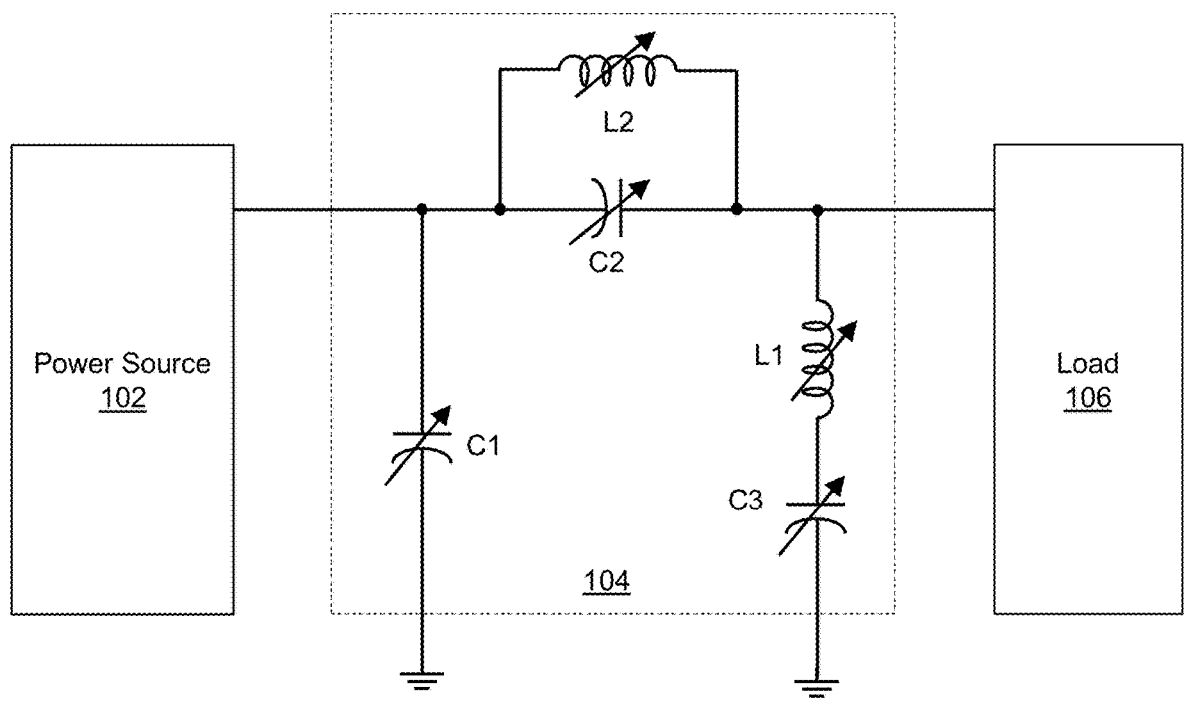
FIG. 13 illustrates a twelfth implementation of the impedance matching network shown in FIG. 1 in accordance with various embodiments of the present disclosure.

FIG. 13 illustrates a twelfth implementation of the impedance matching network shown in FIG. 1 in accordance with various embodiments of the present disclosure. The twelfth implementation of the impedance matching network 104 shown in FIG. 13 is similar to the eleventh implementation shown in FIG. 12 except that the impedance matching network 104 comprises a third capacitor C3. The third capacitor C3 and the first inductor L1 are connected in series between the input of the load 106 and ground.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102.

It should be noted that the connection shown in FIG. 13 is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 14:
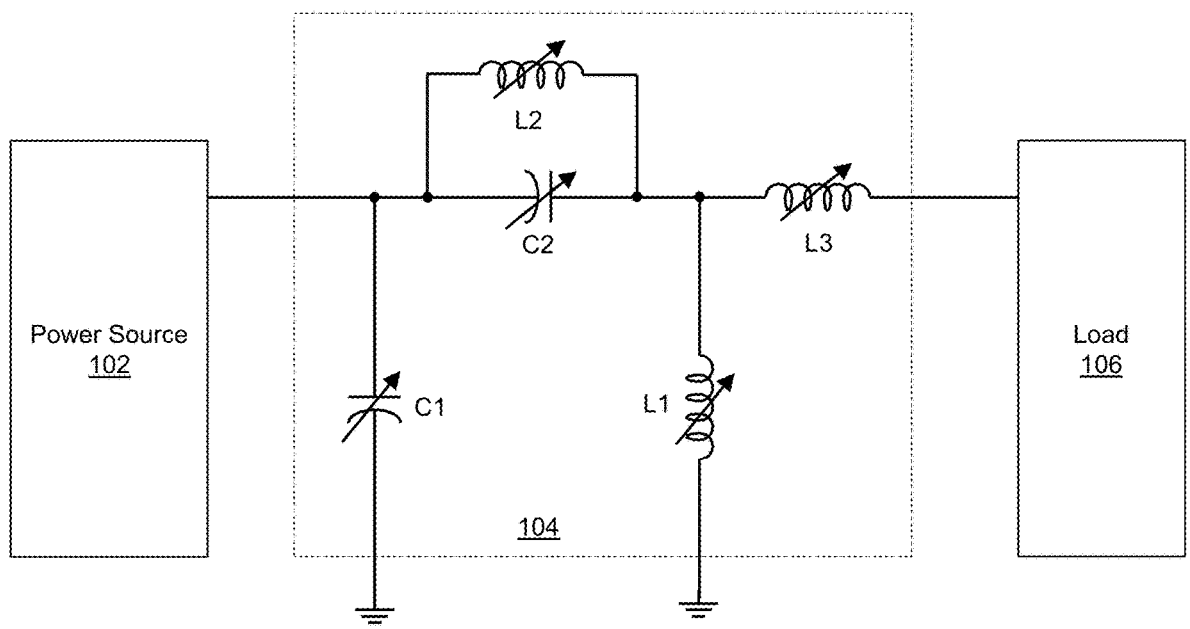
FIG. 14 illustrates a thirteenth implementation of the impedance matching network shown in FIG. 1 in accordance with various embodiments of the present disclosure.

FIG. 14 illustrates a thirteenth implementation of the impedance matching network shown in FIG. 1 in accordance with various embodiments of the present disclosure. The thirteenth implementation of the impedance matching network 104 shown in FIG. 14 is similar to the eleventh implementation shown in FIG. 12 except that the impedance matching network 104 further comprises a third inductor L3.

The third inductor L3 is coupled between a common node of the second capacitor C2 and the first inductor L1, and the input of the load 106. In some embodiments, the inductance of the third inductor L3 is in a range from about 50 nH to about 2500 nH.

In operation, based on the operating frequency of the load 106, the first capacitor C1, the second capacitor C2, the first inductor L1, the second inductor L2 and the third inductor L3 are adjusted individually or in combination such that the impedance of the impedance matching network 104 and the load 106 equals the impedance of the power source 102.

Figure 15:
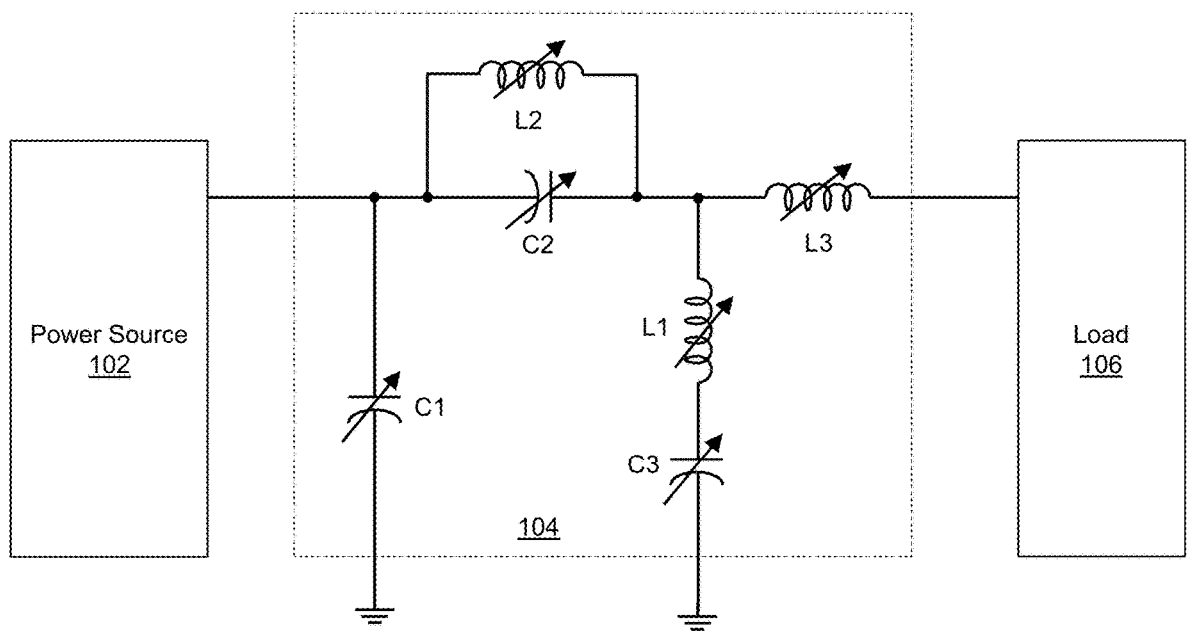
FIG. 15 illustrates a fourteenth implementation of the impedance matching network shown in FIG. 1 in accordance with various embodiments of the present disclosure.

FIG. 15 illustrates a fourteenth implementation of the impedance matching network shown in FIG. 1 in accordance with various embodiments of the present disclosure. The fourteenth implementation of the impedance matching network 104 shown in FIG. 15 is similar to the thirteenth implementation shown in FIG. 14 except that the impedance matching network 104 further comprises a third capacitor C3. The third capacitor C3 and the first inductor L1 are connected in series between a common node of the second inductor L2 and the third inductor L3, and ground.

In operation, based on the operating frequency of the load 106, the first capacitor C1, the second capacitor C2, the third capacitor C3, the first inductor L1, the second inductor L2 and the third inductor L3 are adjusted individually or in combination such that the impedance of the impedance matching network 104 and the load 106 equals the impedance of the power source 102.

It should be noted that the connection shown in FIG. 15 is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 16:
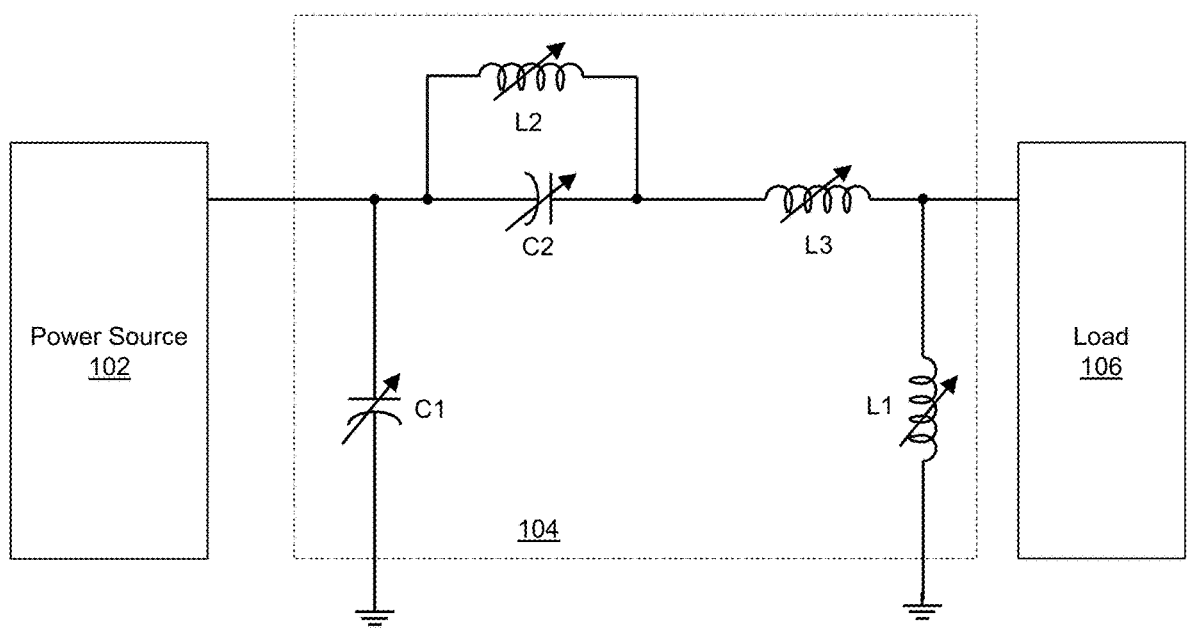
FIG. 16 illustrates a fifteenth implementation of the impedance matching network shown in FIG. 1 in accordance with various embodiments of the present disclosure.

FIG. 16 illustrates a fifteenth implementation of the impedance matching network shown in FIG. 1 in accordance with various embodiments of the present disclosure. The fifteenth implementation of the impedance matching network 104 shown in FIG. 16 is similar to the thirteenth implementation shown in FIG. 14 except that the third inductor L3 is coupled between the second capacitor C2, and a common node of the first inductor L1 the input of the load 106 as shown in FIG. 16.

In operation, based on the operating frequency of the load 106, the first capacitor C1, the second capacitor C2, the first inductor L1, the second inductor L2 and the third inductor L3 are adjusted individually or in combination such that the impedance of the impedance matching network 104 and the load 106 equals the impedance of the power source 102.

Figure 17:
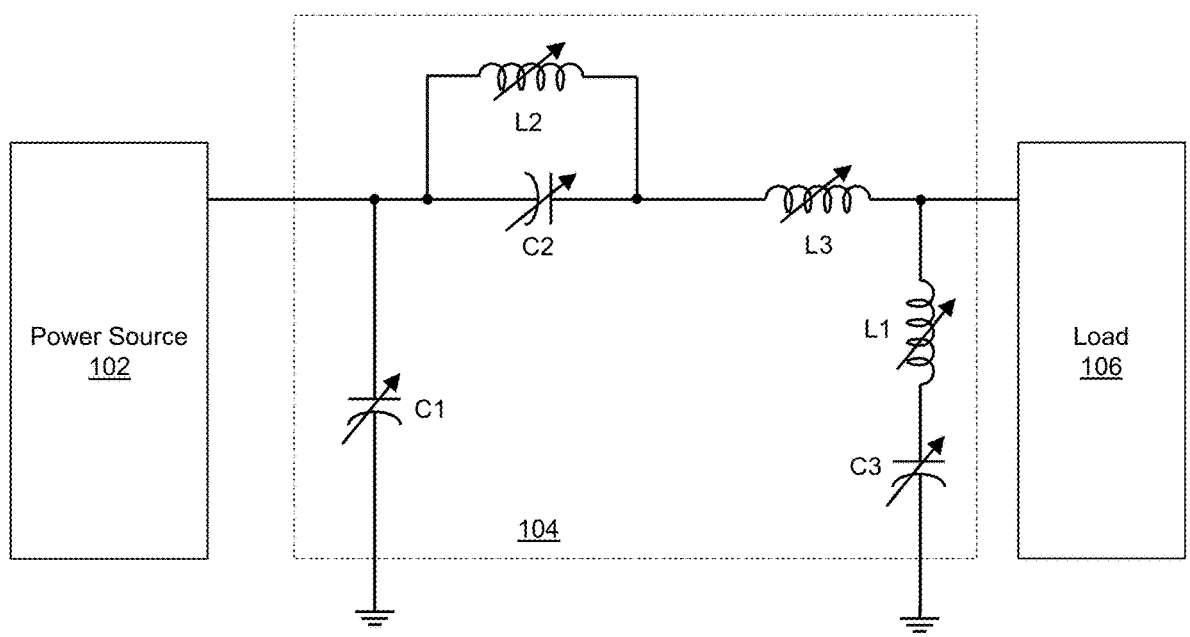
FIG. 17 illustrates a sixteenth implementation of the impedance matching network shown in FIG. 1 in accordance with various embodiments of the present disclosure.

FIG. 17 illustrates a sixteenth implementation of the impedance matching network shown in FIG. 1 in accordance with various embodiments of the present disclosure. The sixteenth implementation of the impedance matching network 104 shown in FIG. 17 is similar to the fifteenth implementation shown in FIG. 16 except that the impedance matching network 104 further comprises a third capacitor C3. The third capacitor C3 and the first inductor L1 are connected in series between the input of the load 106 and ground.

It should be noted that the connection shown in FIG. 17 is merely an example, which should not unduly limit the scope of the claims. One of ordinary skill in the art would recognize many variations, alternatives, and modifications. For example, depending on different design needs, the first inductor L1 and the third capacitor C3 may be swapped.

In operation, based on the operating frequency of the load 106, the first capacitor C1, the second capacitor C2, the third capacitor C3, the first inductor L1, the second inductor L2 and the third inductor L3 are adjusted individually or in combination such that the impedance of the impedance matching network 104 and the load 106 equals the impedance of the power source 102.

Figure 18:
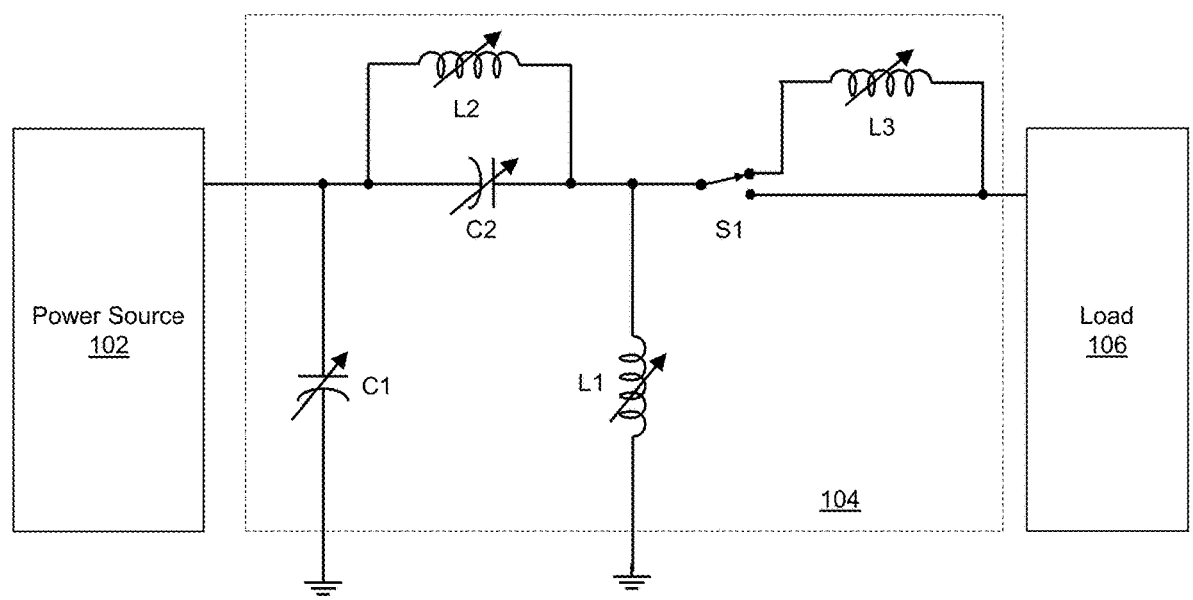
FIG. 18 illustrates a seventeenth implementation of the impedance matching network shown in FIG. 1 in accordance with various embodiments of the present disclosure.

FIG. 18 illustrates a seventeenth implementation of the impedance matching network shown in FIG. 1 in accordance with various embodiments of the present disclosure. The seventeenth implementation of the impedance matching network 104 shown in FIG. 18 is similar to the eleventh implementation shown in FIG. 12 except that the impedance matching network 104 comprises a third inductor L3 and a switch S1. As shown in FIG. 18, the third inductor L3 may be part of the impedance matching network 104 when the switch S1 is configured as shown in FIG. 18. Otherwise, the third inductor L3 may be outside the impedance matching network 104. The structure and operating principle of the switch S1 have been described above with respect to FIG. 8, and hence are not discussed herein. Furthermore, the third inductor L3 is similar to the first inductor L1 and/or the second inductor L2.

In operation, based on the operating frequency of the load 106, the first capacitor C1, the second capacitor C2, the first inductor L1, the second inductor L2 and the third inductor L3 are adjusted individually or in combination such that the impedance of the impedance matching network 104 and the load 106 equals the impedance of the power source 102. Furthermore, the switch S1 provides one more control variable for adjusting the impedance of the impedance matching network 104.

Figure 19:
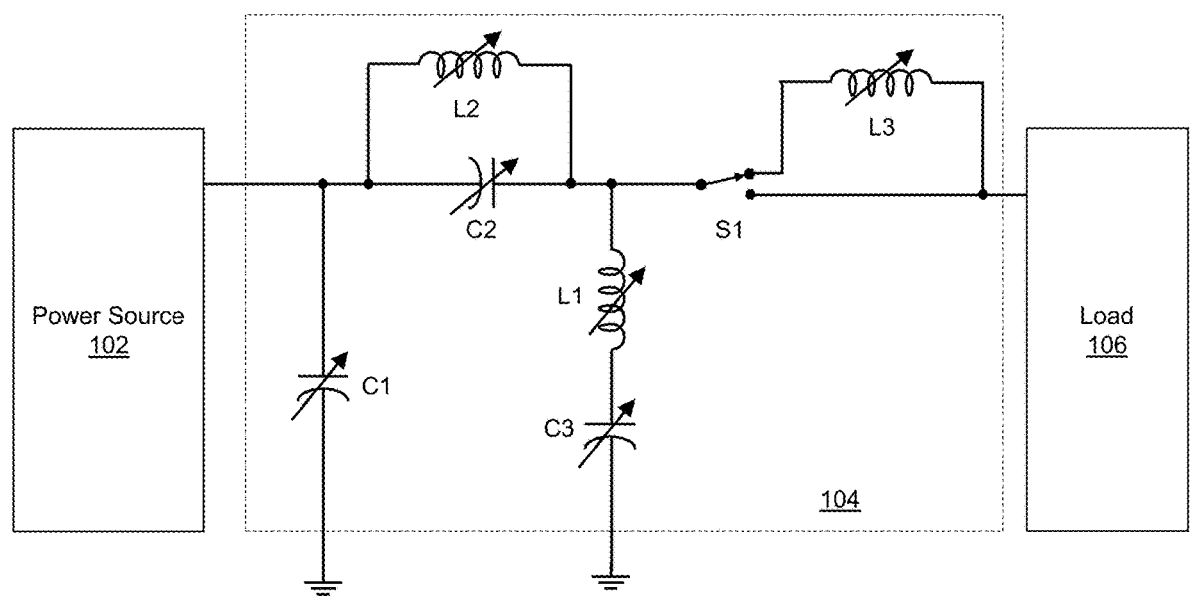
FIG. 19 illustrates an eighteenth implementation of the impedance matching network shown in FIG. 1 in accordance with various embodiments of the present disclosure.

FIG. 19 illustrates an eighteenth implementation of the impedance matching network shown in FIG. 1 in accordance with various embodiments of the present disclosure. The eighteenth implementation of the impedance matching network 104 shown in FIG. 19 is similar to the seventeenth implementation shown in FIG. 18 except that the impedance matching network 104 further comprises a third capacitor C3. The third capacitor C3 and the first inductor L1 are connected in series as shown in FIG. 19.

In operation, based on the operating frequency of the load 106, the first capacitor C1, the second capacitor C2, the third capacitor C3, the first inductor L1, the second inductor L2 and the third inductor L3 are adjusted individually or in combination such that the impedance of the impedance matching network 104 and the load 106 equals the impedance of the power source 102. Furthermore, the switch S1 provides one more control variable for adjusting the impedance of the impedance matching network 104.

It should be noted that the connection shown in FIG. 19 is merely an example, which should not unduly limit the scope of the claims. One of ordinary skill in the art would recognize many variations, alternatives, and modifications. For example, depending on different design needs, the first inductor L1 and the third capacitor C3 may be swapped.

Figure 20:
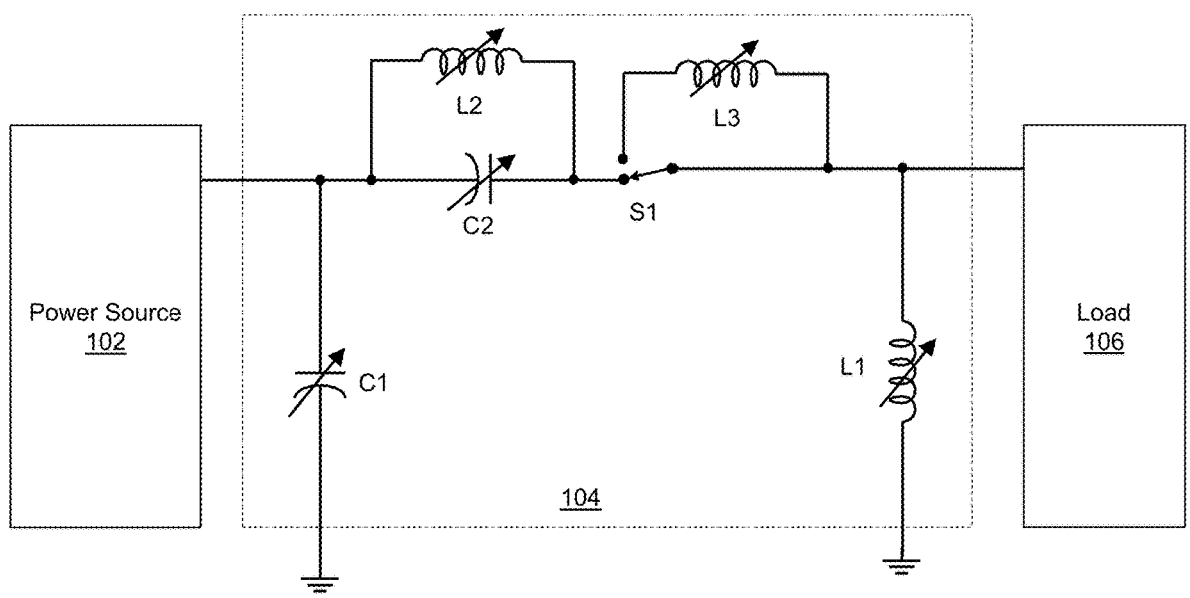
FIG. 20 illustrates a nineteenth implementation of the impedance matching network shown in FIG. 1 in accordance with various embodiments of the present disclosure.

FIG. 20 illustrates a nineteenth implementation of the impedance matching network shown in FIG. 1 in accordance with various embodiments of the present disclosure. The nineteenth implementation of the impedance matching network 104 shown in FIG. 20 is similar to the seventeenth implementation shown in FIG. 18 except that the switch S1 and the third inductor L3 are coupled between the second capacitor C2, and a common node of the first inductor L1 and the input of the load 106.

In operation, based on the operating frequency of the load 106, the first capacitor C1, the second capacitor C2, the first inductor L1, the second inductor L2 and the third inductor L3 are adjusted individually or in combination such that the impedance of the impedance matching network 104 and the load 106 equals the impedance of the power source 102. Furthermore, the switch S1 provides one more control variable for adjusting the impedance of the impedance matching network 104.

Figure 21:
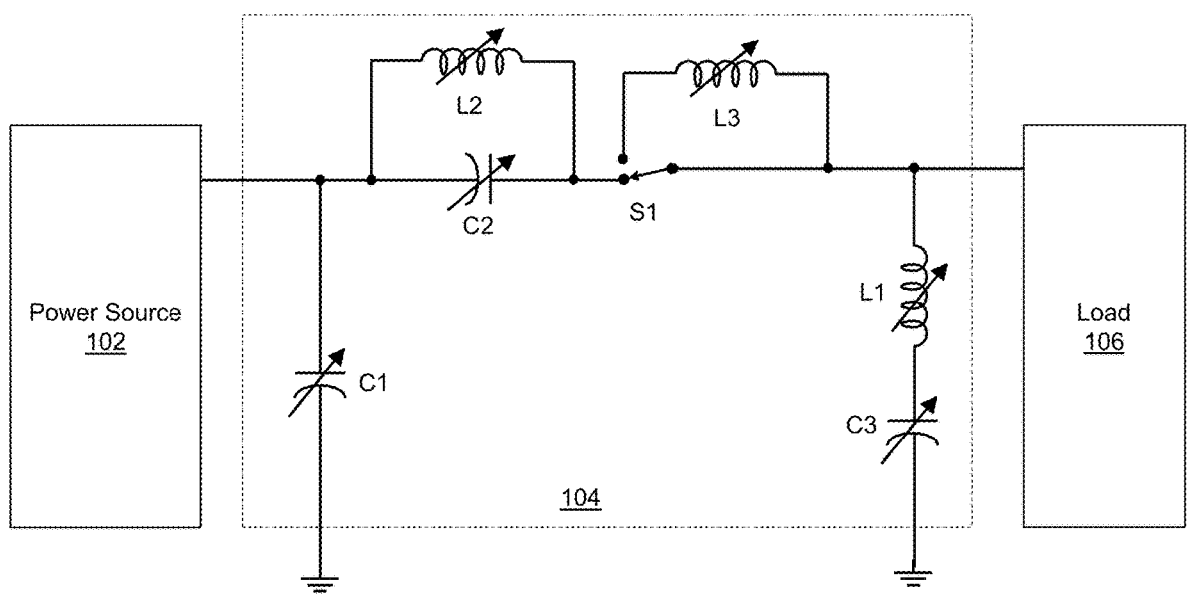
FIG. 21 illustrates a twentieth implementation of the impedance matching network shown in FIG. 1 in accordance with various embodiments of the present disclosure.

FIG. 21 illustrates a twentieth implementation of the impedance matching network shown in FIG. 1 in accordance with various embodiments of the present disclosure. The twentieth implementation of the impedance matching network 104 shown in FIG. 21 is similar to the nineteenth implementation shown in FIG. 20 except that the impedance matching network 104 further comprises a third capacitor C3. The third capacitor C3 and the first inductor L1 are connected in series as shown in FIG. 21.

It should be noted that the connection shown in FIG. 21 is merely an example, which should not unduly limit the scope of the claims. One of ordinary skill in the art would recognize many variations, alternatives, and modifications. For example, depending on different design needs, the first inductor L1 and the third capacitor C3 may be swapped.

In operation, based on the operating frequency of the load 106, the first capacitor C1, the second capacitor C2, the third capacitor C3, the first inductor L1, the second inductor L2 and the third inductor L3 are adjusted individually or in combination such that the impedance of the impedance matching network 104 and the load 106 equals the impedance of the power source 102. Furthermore, the switch S1 provides one more control variable for adjusting the impedance of the impedance matching network 104.

Figure 22:
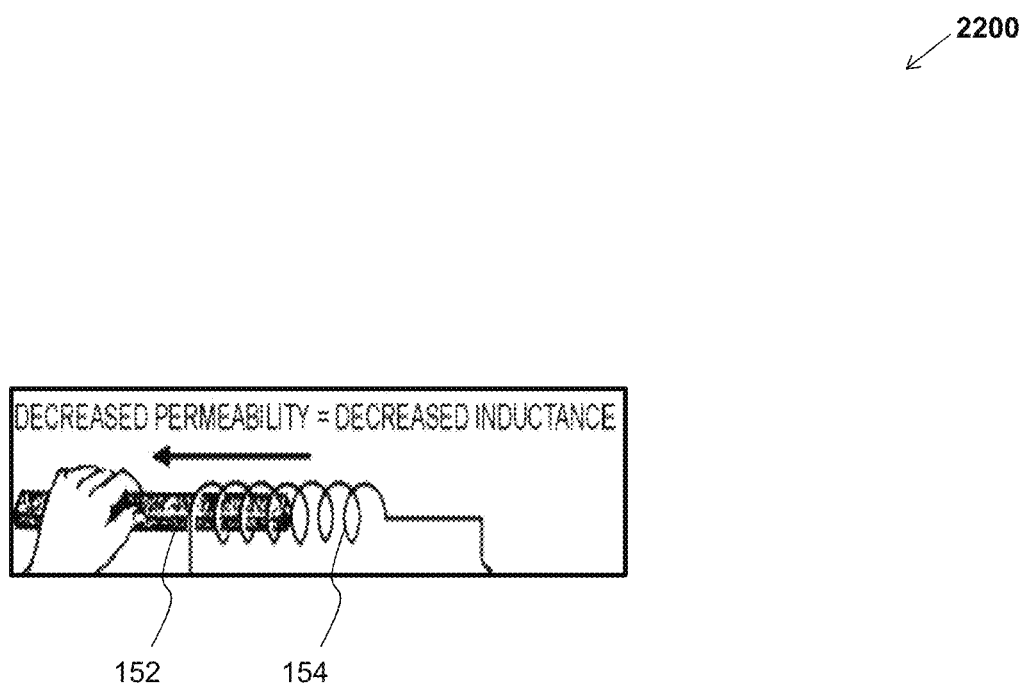
FIG. 22 illustrates a first implementation of the adjustable inductor of the impedance matching network shown in FIG. 1 in accordance with various embodiments of the present disclosure.

FIG. 22 illustrates a first implementation of the adjustable inductor of the impedance matching network shown in FIG. 1 in accordance with various embodiments of the present disclosure. The adjustable inductor 2200 comprises a magnetic core 152 and a coil 154. As shown in FIG. 22, the magnetic core 152 is surrounded by the coil 154. The inductance of the adjustable inductor 2200 may be varied by moving the magnetic core 152 out of or into the coil 154. More particularly, moving the magnetic core 152 into the coil increases the permeability, thereby increasing the magnetic field and the inductance. On the other hand, moving the magnetic core 152 away from the coil decreases the permeability, thereby decreasing the magnetic field and the inductance.

Figure 23:
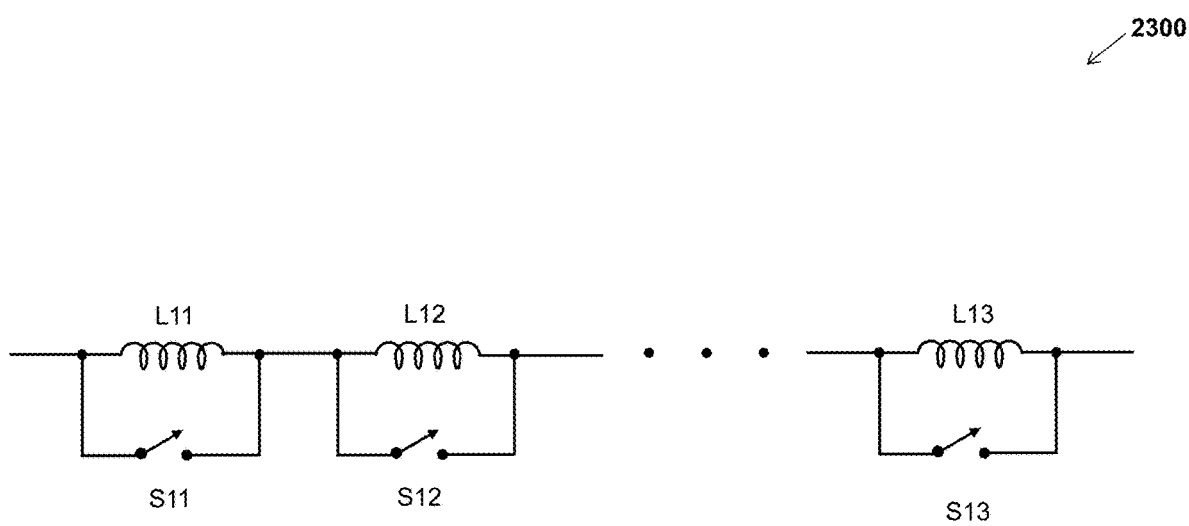
FIG. 23 illustrates a second implementation of the adjustable inductor of the impedance matching network shown in FIG. 1 in accordance with various embodiments of the present disclosure.

FIG. 23 illustrates a second implementation of the adjustable inductor of the impedance matching network shown in FIG. 1 in accordance with various embodiments of the present disclosure. The adjustable inductor 2300 may comprise a plurality of switch-inductor networks connected in series. As shown in FIG. 23, a first switch-inductor network comprises an inductor L11 and a switch S11 connected in parallel. A second switch-inductor network comprises an inductor L12 and a switch S12 connected in parallel. A third switch-inductor network comprises an inductor L13 and a switch S13 connected in parallel. There may be a predetermined number of switch-inductor networks connected between the second switch-inductor network and the third switch-inductor network. By controlling the on and off of the switches of the plurality of switch-inductor networks, the inductance of the adjustable inductor 2300 varies accordingly.

Figure 24:
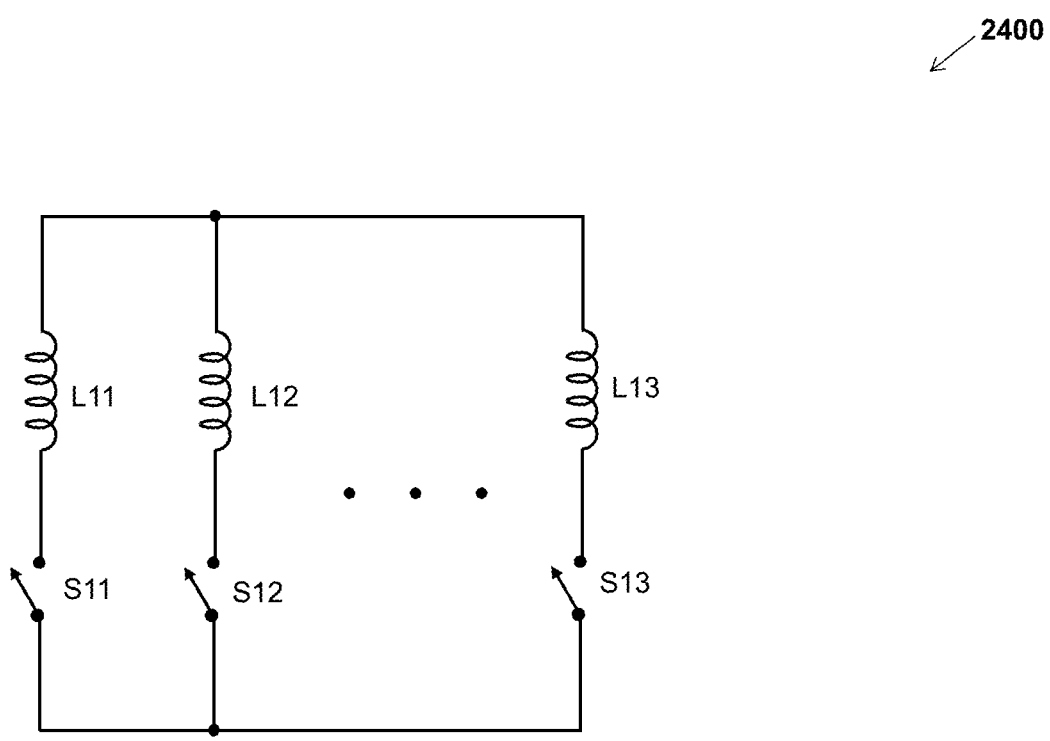
FIG. 24 illustrates a third implementation of the adjustable inductor of the impedance matching network shown in FIG. 1 in accordance with various embodiments of the present disclosure.

FIG. 24 illustrates a third implementation of the adjustable inductor of the impedance matching network shown in FIG. 1 in accordance with various embodiments of the present disclosure. The adjustable inductor 2400 comprises may comprise a plurality of switch-inductor networks connected in parallel. As shown in FIG. 24, a first switch-inductor network comprises an inductor L11 and a switch S11 connected in series. A second switch-inductor network comprises an inductor L12 and a switch S12 connected in series. A third switch-inductor network comprises an inductor L13 and a switch S13 connected in series. There may be a predetermined number of switch-inductor networks connected between the second switch-inductor network and the third switch-inductor network. By controlling the on and off of the switches of the plurality of switch-inductor networks, the inductance of the adjustable inductor 2400 varies accordingly.

It should be noted the implementations of the adjustable inductor shown in FIGS. 22-24 are merely exemplary implementations and are not meant to limit the current embodiments. Other suitable implementations of the adjustable inductor, such as deformation of a coil inductor through stretching, compressing, twisting, any combinations thereof, may alternatively be used.

Figure 25:
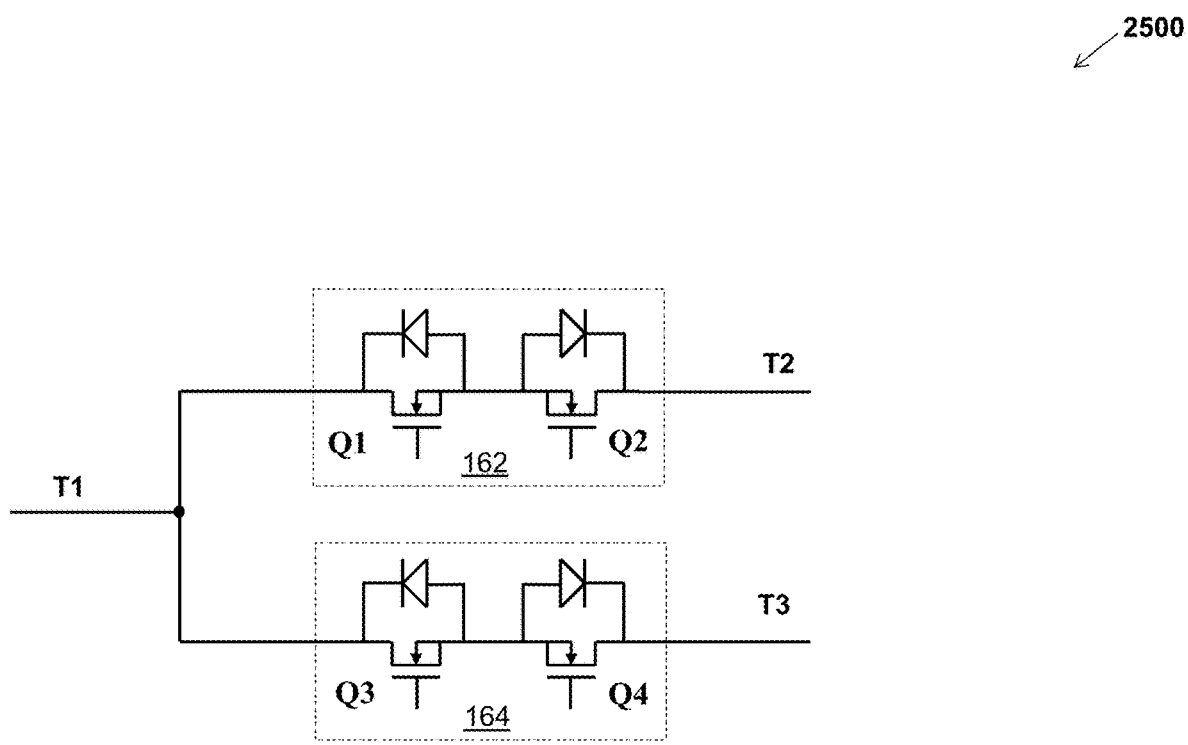
FIG. 25 illustrates an implementation of the switch of the impedance matching network shown in FIG. 1 in accordance with various embodiments of the present disclosure.

FIG. 25 illustrates an implementation of the switch of the impedance matching network shown in FIG. 1 in accordance with various embodiments of the present disclosure. The switch 2500 comprises two isolation switches 162 and 164. A first isolation switch 162 comprises two back-to-back connected transistors Q1 and Q2 between a first terminal T1 and a second terminal T2. A second isolation switch 164 comprises two back-to-back connected transistors Q3 and Q4 between the first terminal T1 and a third terminal T3. The isolation switches shown in FIG. 25 are employed to block current in both directions when the transistors are turned off. In other words, the isolation switches provide a bi-directional cutoff.

As shown in FIG. 25, the isolation switches are formed by MOSFETs. This diagram is merely an example, which should not unduly limit the scope of the claims. A skilled person in the art will appreciate that there can be many variations of an embodiment of this disclosure. For example, the isolation switches may be formed by any other suitable switches such as IGBT, GaN and the like.

Figure 26:
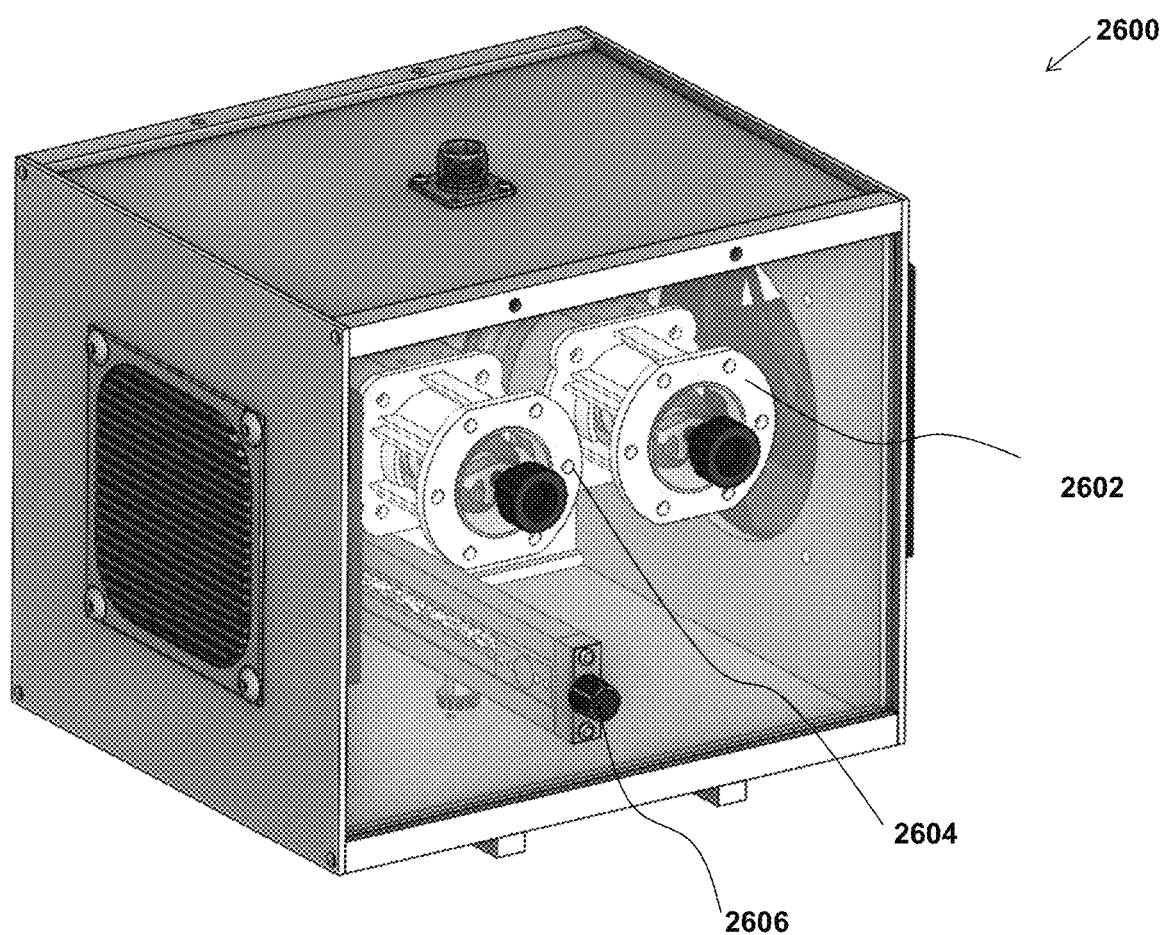
FIG. 26 illustrates a perspective view of a first implementation of the impedance matching network shown in FIG. 1 in accordance with various embodiments of the present disclosure.

FIG. 26 illustrates a perspective view of a first implementation of the impedance matching network shown in FIG. 1 in accordance with various embodiments of the present disclosure. The impedance matching network 2600 is placed inside a box. A first capacitor 2602 and a second capacitor 2604 are placed over a first inductor 2606. In some embodiments, the first capacitor 2602 is a variable series capacitor. The capacitance of the first capacitor 2602 may be adjusted in a mechanical matter. The second capacitor 2604 is a variable shunt capacitor. The capacitance of the second capacitor 2604 may be adjusted in a mechanical matter. The first inductor 2606 is a variable shunt inductor. The inductance of the first inductor 2606 may be adjusted in a mechanical matter.

Figure 27:
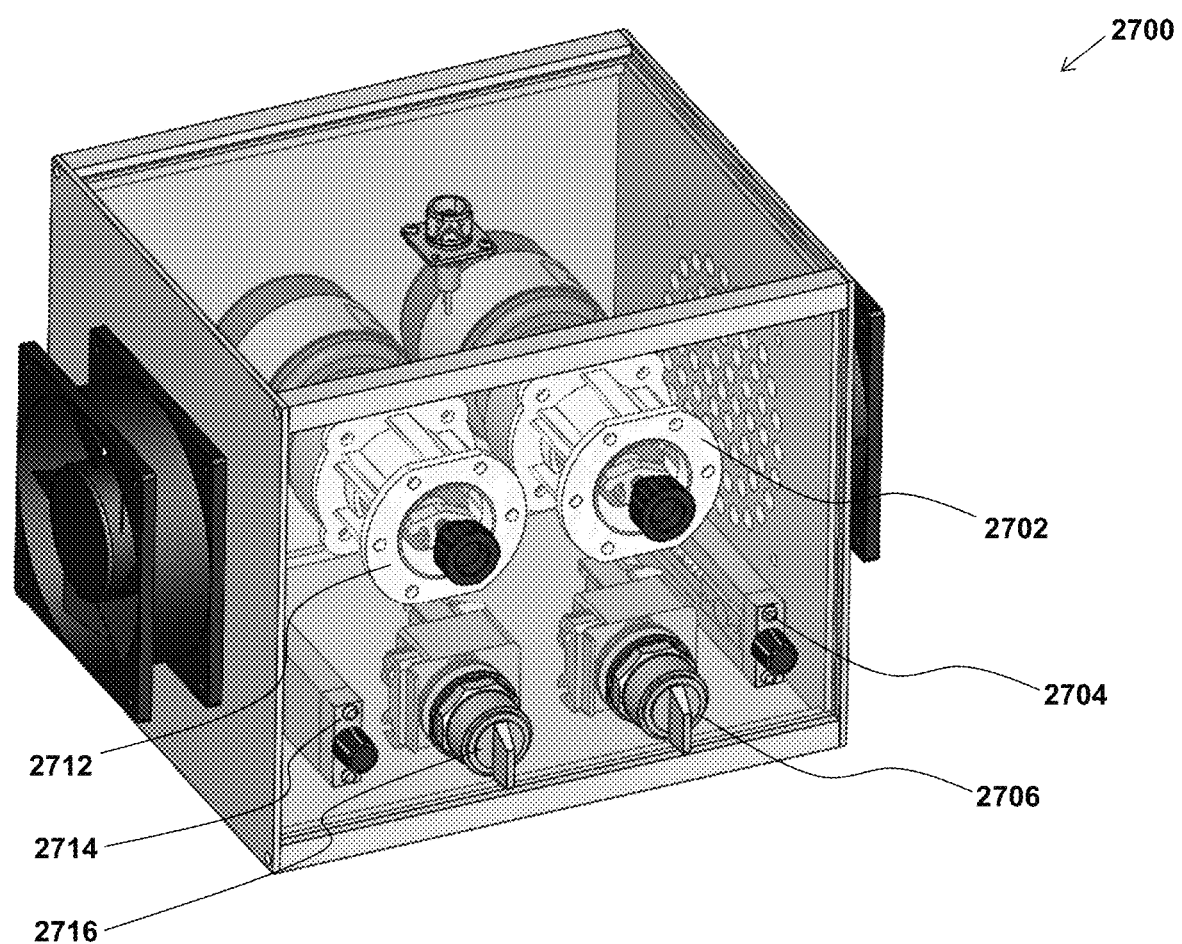
FIG. 27 illustrates a perspective view of a second implementation of the impedance matching network shown in FIG. 1 in accordance with various embodiments of the present disclosure.

FIG. 27 illustrates a perspective view of a second implementation of the impedance matching network shown in FIG. 1 in accordance with various embodiments of the present disclosure. The impedance matching network 2700 is placed inside a box. A first capacitor 2702 and a second capacitor 2712 are placed over a first isolation switch 2706 and a second isolation switch 2716, respectively. A first inductor 2704 is placed adjacent to the first isolation switch 2706. A second inductor 2714 is placed adjacent to the second isolation switch 2716. In some embodiments, the first capacitor 2702 is a variable series capacitor. The second capacitor 2712 is a variable shunt capacitor. The first inductor 2704 and the second inductor 2714 are variable inductors.

Figure 28:
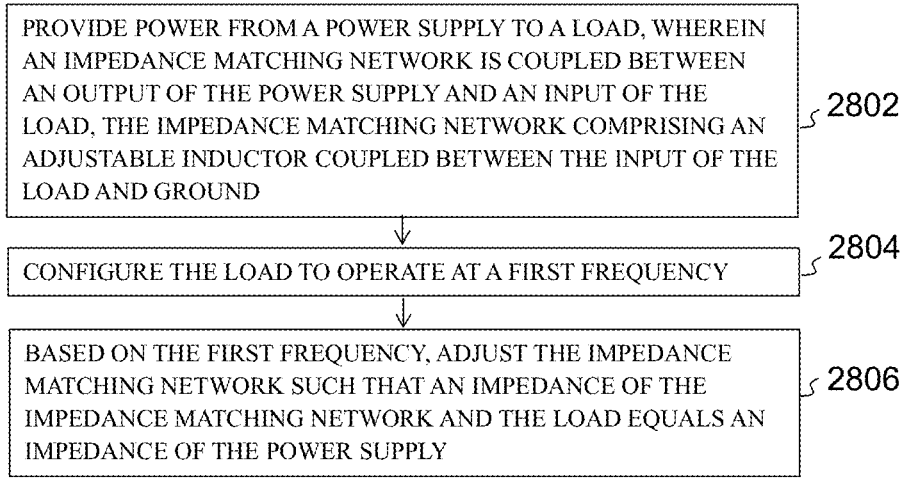
FIG. 28 illustrates a flow chart of a method for controlling the impedance matching network shown in FIG. 1 in accordance with various embodiments of the present disclosure.

FIG. 28 illustrates a flow chart of a method for controlling the impedance matching network shown in FIG. 1 in accordance with various embodiments of the present disclosure. This flowchart shown in FIG. 28 is merely an example, which should not unduly limit the scope of the claims. One of ordinary skill in the art would recognize many variations, alternatives, and modifications. For example, various steps illustrated in FIG. 28 may be added, removed, replaced, rearranged and repeated.

A power source is coupled to a load through an impedance matching network. The power source is a high frequency RF power source. The load is a plasma chamber. The plasma chamber may operate in a wide frequency range. The impedance matching network comprises a plurality of adjustable capacitive/inductive elements as shown in FIGS. 2-21 and 29.

At step 2802, power is provided from the power source to the load. The impedance matching network is coupled between an output of the power source and an input of the load. The impedance matching network comprising an adjustable inductor coupled between the input of the load and ground.

At step 2804, the load (e.g., the plasma chamber) is configured to operate at a first frequency (e.g., one predetermined frequency in a range from about 400 kHz to about 220 MHz).

At step 2806, based on the first frequency, the impedance matching network is adjusted such that an impedance of the impedance matching network and the load equals an impedance of the power source.

Figure 29:
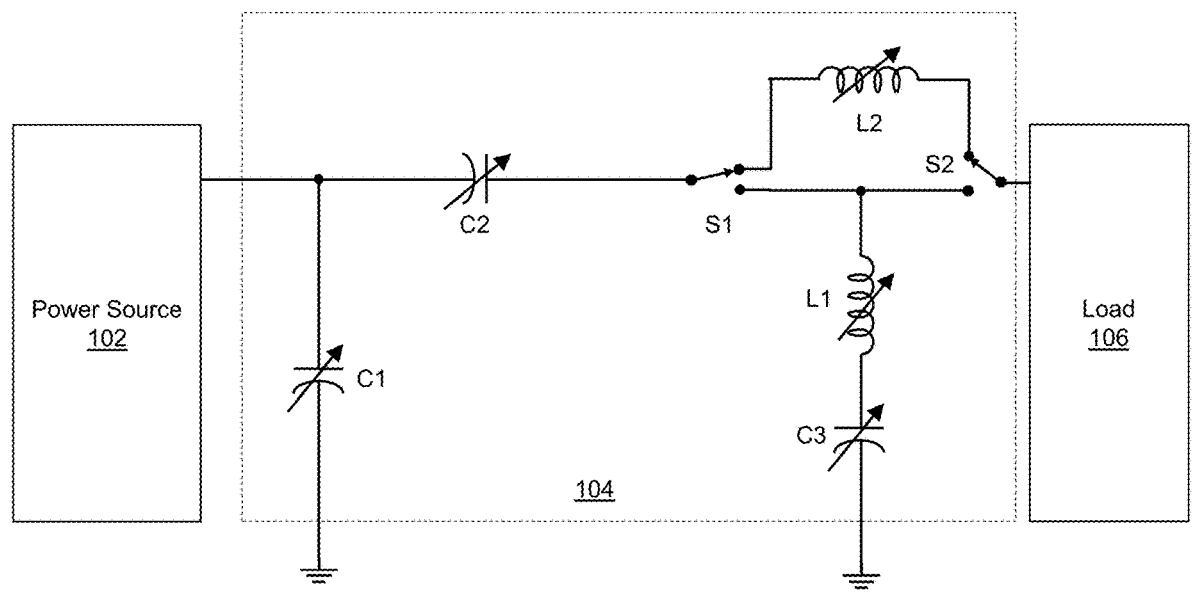
FIG. 29 illustrates another implementation of the impedance matching network shown in FIG. 1 in accordance with various embodiments of the present disclosure.

FIG. 29 illustrates another implementation of the impedance matching network shown in FIG. 1 in accordance with various embodiments of the present disclosure. The implementation of the impedance matching network 104 shown in FIG. 29 is similar to the tenth implementation shown in FIG. 11 except that the impedance matching network 104 comprises one more switch S2 connected to the load 106. In particular, the switch S2 has three terminals. A first terminal of switch S2 is connected to the second inductor L2. A second terminal of switch S2 is connected to the first inductor L1. A third terminal of switch S2 is connected to the input of the load 106. The first inductor L1 is connected to a common node of the switch S1 and the switch S2. The function of the switch S2 is similar to that of the switch S1, and hence is not discussed again herein.

In operation, based on the operating frequency of the load 106, the first capacitor C1, the second capacitor C2, the third capacitor C3, the first inductor L1 and the second inductor L2 are adjusted individually or in combination such that the impedance of the impedance matching network 104 and the load 106 equals the impedance of the power source 102. Furthermore, the switches S1 and S2 provide two more control variables for adjusting the impedance of the impedance matching network 104. More particularly, the switches S1 and S2 are configured such that both the first inductor L1 and the second inductor L2 function as selectable elements of the impedance matching network 104 by controlling the turn on and off of switches S1 and S2, respectively.

It should be noted that the connection shown in FIG. 29 is merely an example, which should not unduly limit the scope of the claims. One of ordinary skill in the art would recognize many variations, alternatives, and modifications. For example, depending on different design needs, the first inductor L1 and the third capacitor C3 may be swapped.

Example embodiments of the invention are summarized here. Other embodiments can also be understood from the entirety of the specification as well as the claims filed herein.

Example 1. An apparatus including: a load configured to operate in a predetermined frequency range; a power supply configured to provide power for the load; and an impedance matching network coupled between the power supply and the load, wherein the impedance matching network comprises a first adjustable inductor coupled between an input of the load and ground, and the impedance matching network is configured such that, in the predetermined frequency range, an impedance of the impedance matching network and the load equals an impedance of the power supply.

Example 2. The apparatus of claim 1, where the load is a plasma chamber configured to operate in the predetermined frequency range from about 400 kHz to about 220 MHz.

Example 3. The apparatus of one of examples 1 and 2, where the impedance matching network includes an L-shaped network and the first adjustable inductor, and where the L-shaped network includes a series capacitor coupled between an output of the power supply and the input of the load; and a shunt capacitor connected between the output of the power supply and ground.

Example 4. The apparatus of claim 3, further including: an adjustable capacitor connected in series with the first adjustable inductor.

Example 5. The apparatus of claim 3, further including: a second adjustable inductor connected between a common node of the series capacitor and the first adjustable inductor, and the input of the load.

Example 6. The apparatus of claim 3, further including: a second adjustable inductor connected in series with the series capacitor.

Example 7. The apparatus of claim 3, further including: a second adjustable inductor connected in series with the series capacitor.

Example 8. The apparatus of claim 3, further including: a second adjustable inductor connected in parallel with the series capacitor; and a third adjustable inductor connected between a common node of the series capacitor and the second adjustable inductor, and the input of the load.

Example 9. The apparatus of claim 3, further including: a second adjustable inductor coupled to the input of the load; and a first switch connected to the second adjustable inductor, where the first switch is configured such that the second adjustable inductor functions as a selectable element of the impedance matching network by controlling the first switch.

Example 10. The apparatus of claim 3, further including: a second adjustable inductor coupled to the input of the load; a first switch connected between the series capacitor and the second adjustable inductor; and a second switch connected between the second adjustable inductor and the input of the load, where the first adjustable inductor is connected to a common node of the first switch and the second switch; and the first switch and the second switch are configured such that both the first adjustable inductor and the second adjustable inductor function as selectable elements of the impedance matching network by controlling the first switch and the second switch.

Example 11. A method including: providing power from a power supply to a load, where an impedance matching network is coupled between an output of the power supply and an input of the load, the impedance matching network comprising an adjustable inductor coupled between the input of the load and ground; configuring the load to operate at a first frequency; and based on the first frequency, adjusting the impedance matching network such that an impedance of the impedance matching network and the load equals an impedance of the power supply.

Example 12. The method of example 11, further including: configuring the load to operate in a second frequency in a predetermined frequency range; and based on the second frequency, adjusting the impedance matching network such that in the predetermined frequency range, the impedance of the impedance matching network and the load equals the impedance of the power supply.

Example 13. The method of one of examples 11 and 12, where the impedance matching network includes: a series capacitor connected between the output of the power supply and the input of the load; a shunt capacitor connected between the output of the power supply and ground; and the adjustable inductor.

Example 14. The method of example 13, where the series capacitor is a first adjustable capacitor; and the shunt capacitor is a second adjustable capacitor.

Example 15. The method of example 14, further including: dynamically adjusting the first adjustable capacitor, the second adjustable capacitor and the adjustable inductor such that the impedance of the impedance matching network and the load equals the impedance of the power supply.

Example 16. A system including: a plasma chamber coupled to a power source; and an impedance matching network coupled between the power source and the plasma chamber, wherein the impedance matching network comprises an L-shaped network and a first adjustable inductor coupled between an input of the plasma chamber and ground, and wherein the impedance matching network is configured such that, in a predetermined frequency range, an impedance of the impedance matching network and the plasma chamber is substantially equal to an impedance of the power source.

Example 17. The system of example 16, where the impedance matching network includes: a series capacitor connected between an output of the power source and the input of the plasma chamber; a shunt capacitor connected between the output of the power source and ground; and the first adjustable inductor.

Example 18. The system of one of examples 16 and 17, further including: an adjustable capacitor connected in series with the first adjustable inductor.

Example 19. The system of one of examples 17 and 18, further including: a second adjustable inductor connected in parallel with the series capacitor.

Example 20. The system of one of examples 17 and 18, further including: a second adjustable inductor coupled to the input of the plasma chamber; and an isolation switch connected to the second adjustable inductor, wherein the isolation switch is configured such that the second adjustable inductor is a selectable element of the impedance matching network by controlling the isolation switch.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a load configured to operate in a predetermined frequency range;
a power supply configured to provide power for the load; and
an impedance matching network coupled between the power supply and the load, wherein the impedance matching network comprises an L-shaped network, a first adjustable inductor, a second adjustable inductor, a first switch and a second switch, and the impedance matching network is configured such that, in the predetermined frequency range, an impedance of the impedance matching network and the load equals an impedance of the power supply, and
wherein the L-shaped network comprises a series adjustable capacitor coupled between an output of the power supply and an input of the load, and a shunt adjustable capacitor connected between the output of the power supply and ground;
the second adjustable inductor is coupled to the input of the load, and wherein the first switch is a three-terminal selector switch having a first terminal connected to the series adjustable capacitor, a second terminal connected to the second adjustable inductor, and a third terminal connected to the first adjustable inductor; and
the second switch is connected between the second adjustable inductor and the input of the load, and wherein the second switch is a three-terminal selector switch having a first terminal connected to the first adjustable inductor, a second terminal connected to the second adjustable inductor, and a third terminal directly connected to the load, and wherein:
the first adjustable inductor is connected to a common node of the first switch and the second switch; and
the first switch and the second switch are configured such that both the first adjustable inductor and the second adjustable inductor function as selectable elements of the impedance matching network by controlling the first switch and the second switch.

2. The apparatus of claim 1, wherein:
the load is a plasma chamber configured to operate in the predetermined frequency range from about 400 kHz to about 220 MHz.

3. A method comprising:
providing power from a power supply to a load, wherein an impedance matching network is coupled between an output of the power supply and an input of the load, the impedance matching network comprising an L-shaped network, a first adjustable inductor, a second adjustable inductor, a first switch and a second switch, wherein:
the L-shaped network comprises a series adjustable capacitor coupled between an output of the power supply and an input of the load, and a shunt adjustable capacitor connected between the output of the power supply and ground;
the second adjustable inductor is coupled to the input of the load, and wherein the first switch is a three-terminal selector switch having a first terminal connected to the series adjustable capacitor, a second terminal connected to the second adjustable inductor, and a third terminal connected to the first adjustable inductor; and the second switch is connected between the second adjustable inductor and the input of the load, and wherein the second switch is a three-terminal selector switch having a first terminal connected to the first adjustable inductor, a second terminal connected to the second adjustable inductor, and a third terminal directly connected to the load, and wherein:

the first adjustable inductor is connected to a common node of the first switch and the second switch; and the first switch and the second switch are configured such that both the first adjustable inductor and the second adjustable inductor function as selectable elements of the impedance matching network by controlling the first switch and the second switch;

configuring the load to operate at a first frequency; and based on the first frequency, adjusting the impedance matching network such that an impedance of the impedance matching network and the load equals an impedance of the power supply.

4. The method of claim 3, further comprising:

configuring the load to operate in a second frequency in a predetermined frequency range; and based on the second frequency, adjusting the impedance matching network such that in the predetermined frequency range, the impedance of the impedance matching network and the load equals the impedance of the power supply.

5. The method of claim 3, further comprising:

dynamically adjusting the series adjustable capacitor, the shunt adjustable capacitor, the first adjustable inductor and the second adjustable inductor such that the impedance of the impedance matching network and the load equals the impedance of the power supply.

6. A system comprising:

a plasma chamber coupled to a power source; and an impedance matching network coupled between the power source and the plasma chamber, wherein the impedance matching network comprises an L-shaped network, a first switch, a second switch, a first adjustable inductor and a second adjustable inductor coupled between an input of the plasma chamber and ground, and wherein the impedance matching network is configured such that, in a predetermined frequency range, an impedance of the impedance matching network and the plasma chamber is equal to an impedance of the power source, and wherein: the L-shaped network comprises a series adjustable capacitor coupled between an output of the power source and an input of the plasma chamber, and a shunt adjustable capacitor connected between the output of the power source and ground;

the second adjustable inductor is coupled to the input of the plasma chamber, and wherein the first switch is a three-terminal selector switch having a first terminal connected to the series adjustable capacitor, a second terminal connected to the second adjustable inductor, and a third terminal connected to the first adjustable inductor; and the second switch is connected between the second adjustable inductor and the input of the plasma chamber, and wherein the second switch is a three-terminal selector switch having a first terminal connected to the first adjustable inductor, a second terminal connected to the second adjustable inductor, and a third terminal directly connected to the plasma chamber, and wherein:

the first adjustable inductor is connected to a common node of the first switch and the second switch; and the first switch and the second switch are configured such that both the first adjustable inductor and the second adjustable inductor function as selectable elements of the impedance matching network by controlling the first switch and the second switch.

* * * * *